(12) United States Patent
Suzuki et al.

(10) Patent No.: US 9,536,949 B2
(45) Date of Patent: Jan. 3, 2017

(54) NITRIDE SEMICONDUCTOR DEVICE COMPRISING NITRIDE SEMICONDUCTOR REGROWTH LAYER

(71) Applicant: Panasonic Intellectual Property Management Co., Ltd., Osaka (JP)

(72) Inventors: Asamira Suzuki, Osaka (JP); Songbaek Choe, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/958,483

(22) Filed: Dec. 3, 2015

(65) Prior Publication Data
US 2016/0172473 A1 Jun. 16, 2016

(30) Foreign Application Priority Data
Dec. 11, 2014 (JP) ................................ 2014-250964

(51) Int. Cl.
*H01L 29/08* (2006.01)
*H01L 29/778* (2006.01)
(Continued)

(52) U.S. Cl.
CPC ....... *H01L 29/0843* (2013.01); *H01L 29/7786* (2013.01); *H01L 29/045* (2013.01); *H01L 29/1066* (2013.01); *H01L 29/2003* (2013.01)

(58) Field of Classification Search
CPC ............. H01L 29/0843; H01L 29/7786; H01L 29/2003; H01L 29/7787; H01L 29/66462; H01L 29/778; H01L 29/267
See application file for complete search history.

(56) References Cited

U.S. PATENT DOCUMENTS 8,344,452 B2 * 1/2013 Lindert ............ H01L 21/28079
257/344
2009/0057720 A1 3/2009 Kaneko
(Continued)

FOREIGN PATENT DOCUMENTS

JP 8-088363 4/1996
JP 8-124940 5/1996
(Continued)

OTHER PUBLICATIONS

A. L. Corrion et al., "Enhancement-Mode AlN/GaN/AlGaN DHFET With 700-mS/mm gm and 112-GHz fT" IEEE EDL, vol. 31, No. 10, pp. 1116-1118, 2010.
(Continued)

*Primary Examiner* — Tucker J Wright
(74) *Attorney, Agent, or Firm* — McDermott Will & Emery LLP

(57) ABSTRACT

A nitride semiconductor device according to one embodiment of the present disclosure includes: a substrate; a first nitride semiconductor layer supported by the substrate; a second nitride semiconductor layer disposed on the first nitride semiconductor layer; a source-side nitride semiconductor regrowth layer which is located on a source-side recess region; a drain-side nitride semiconductor regrowth layer which is located on a drain-side recess region located apart from the source-side recess region; a first diffusion layer which is disposed in the first nitride semiconductor layer and contains Ge diffused from the source-side nitride semiconductor regrowth layer; and a second diffusion layer which is disposed in the first nitride semiconductor layer and contains Ge diffused from the drain-side nitride semiconductor regrowth layer.

22 Claims, 16 Drawing Sheets

(51) Int. Cl.
  *H01L 29/04* (2006.01)
  *H01L 29/10* (2006.01)
  *H01L 29/20* (2006.01)

(56) References Cited

U.S. PATENT DOCUMENTS

| | | |
|---|---|---|
| 2009/0121775 A1 | 5/2009 | Ueda et al. |
| 2011/0062438 A1 | 3/2011 | Kaneko |
| 2011/0284865 A1 | 11/2011 | Inoue et al. |
| 2013/0105863 A1 | 5/2013 | Lee et al. |
| 2014/0024181 A1* | 1/2014 | Adam .................. H01L 21/84 438/154 |
| 2015/0311331 A1 | 10/2015 | Yamada et al. |

FOREIGN PATENT DOCUMENTS

| | | |
|---|---|---|
| JP | 2004-273486 | 9/2004 |
| JP | 2007-073873 | 3/2007 |
| JP | 2008-288474 | 11/2008 |
| JP | 2009-076845 | 4/2009 |
| JP | 2009-246205 | 10/2009 |
| JP | 2013-098556 | 5/2013 |
| JP | 2014-197644 | 10/2014 |
| WO | 2007/007548 | 1/2007 |
| WO | 2009/001888 | 12/2008 |
| WO | 2010/074275 | 7/2010 |
| WO | 2014/020809 | 2/2014 |

OTHER PUBLICATIONS

O. Hillt et al., "Normally-off High-Voltage p-GaN Gate GaN HFET with Carbon-Doped Buffer" ISPSD Tech. Dig., pp. 239-242, 2011.
M. Kanamura et al., "Enhancement-Mode GaN MIS-HEMTs With n-GaN/i-AlN/n-GaN Triple Cap Layer and High-k Gate Dielectrics" IEEE EDL, vol. 31, No. 3, pp. 189-191, 2010.

* cited by examiner

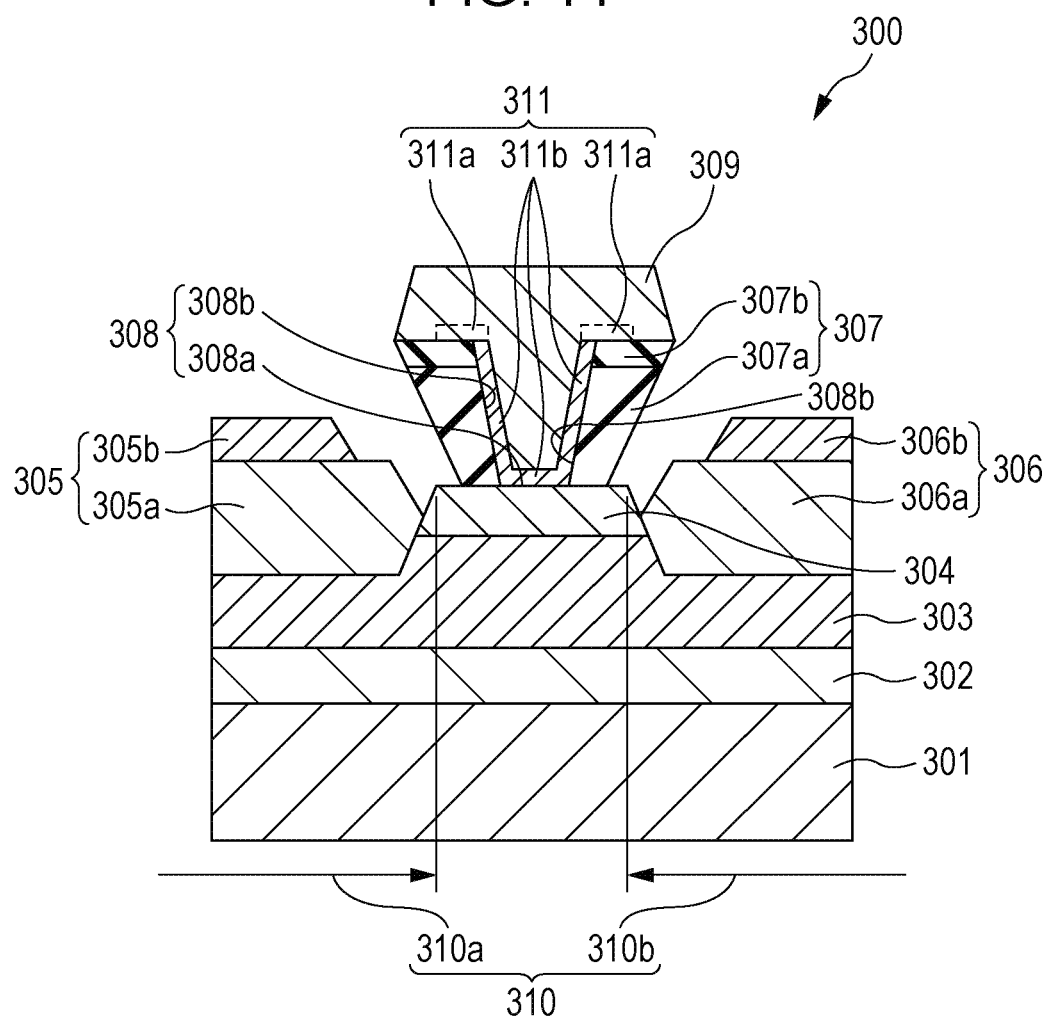

NITRIDE SEMICONDUCTOR DEVICE COMPRISING NITRIDE SEMICONDUCTOR REGROWTH LAYER

BACKGROUND

1. Technical Field

The present disclosure relates to a nitride semiconductor device and a method for manufacturing the same.

2. Description of the Related Art

Nitride semiconductors have a high dielectric breakdown voltage, a high carrier mobility, and the like as compared to those of silicon semiconductors forming semiconductor devices which have been currently used in various fields. Accordingly, it is attempted to realize a switching element, such as a converter, using a nitride semiconductor. For example, in Japanese Unexamined Patent Application Publication Nos. 2004-273486 and 2009-076845, a heterojunction field effect transistor (HFET) using a nitride semiconductor has been disclosed as one example of a switching element.

SUMMARY

In one general aspect, the techniques disclosed here feature a nitride semiconductor device comprising: a substrate; a first nitride semiconductor layer supported by the substrate; a second nitride semiconductor layer which is disposed on the first nitride semiconductor layer and which includes a second nitride semiconductor having a larger bandgap than that of a first nitride semiconductor included in the first nitride semiconductor layer; a source-side nitride semiconductor regrowth layer which is located on a source-side recess region and which includes a third nitride semiconductor containing Ge, the source-side recess region having a first recess which extends through a part of the second nitride semiconductor layer to reach the first nitride semiconductor layer; a source electrode electrically connected to the source-side nitride semiconductor regrowth layer; a drain-side nitride semiconductor regrowth layer which is located on a drain-side recess region and which includes a fourth nitride semiconductor containing Ge, the drain-side recess region located apart from the source-side recess region and having a second recess which extends through another part of the second nitride semiconductor layer to reach the first nitride semiconductor layer; a drain electrode electrically connected to the drain-side nitride semiconductor regrowth layer; a gate electrode located on the second nitride semiconductor layer between the source-side nitride semiconductor regrowth layer and the drain-side nitride semiconductor regrowth layer; a first diffusion layer which is disposed in the first nitride semiconductor layer and which contains Ge diffused from the source-side nitride semiconductor regrowth layer to the first nitride semiconductor layer; and a second diffusion layer which is disposed in the first nitride semiconductor layer and which contains Ge diffused from the drain-side nitride semiconductor regrowth layer to the first nitride semiconductor layer.

According to one non-limiting and exemplary embodiment of the present disclosure; a nitride semiconductor device having a low on-resistance can be realized.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 14 is a schematic cross-sectional view showing the structure of a nitride semiconductor device according to a second embodiment;

DETAILED DESCRIPTION (Findings of Present Inventors)

The resistance of a nitride semiconductor HFET was investigated in detail by the inventors of the present disclosure. In the specification of the present disclosure, a nitride semiconductor includes GaN and a compound semiconductor in which gallium (Ga) of GaN is partially or fully substituted by at least one selected from the group of aluminum (Al) and indium (In). The compound semiconductor as described above is represented by a composition formula of $Al_xGa_yIn_zN$ ($0 \le x, y, z \le 1$, $x+y+z=1$). Hereinafter, the nitride semiconductor is represented by GaN.

Figure 1:
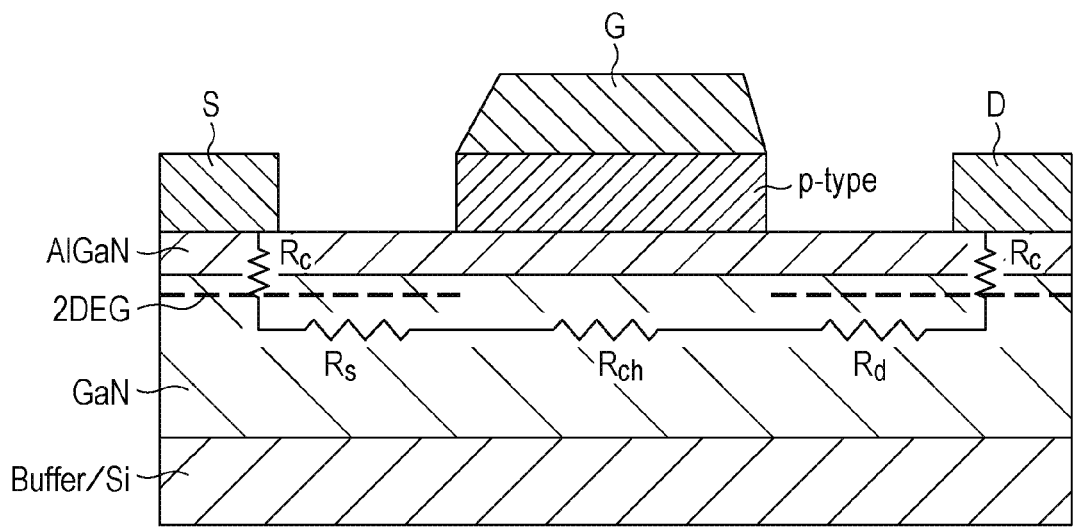
FIG. 1 is a schematic view showing components forming an on-resistance of a HFET.

FIG. 1 schematically shows the structure of a related GaN HFET disclosed in Japanese Unexamined Patent Application Publication No. 2000-076845. In this HFET, a two-dimensional electron gas (2DEG) formed by a hetero junction is used as a carrier. In addition, in order to realize a normally-off characteristic, a p-type semiconductor layer is provided under a gate electrode.

As shown in FIG. 1, the resistance component of this HFET is roughly formed of three segments. In particular, there are contact resistances Rc each formed between the 2DEG and a source electrode or a drain electrode, a channel resistance Rch under the gate electrode, and access resistances Rs and Rd each formed of a 2DEG portion excluding a portion under the gate electrode. Those three resistances are synthesized to form an on-resistance of the HFET.

In the HFET shown in FIG. 1, in order to realize a normally-off characteristic, it is required to decrease the thickness of an AlGaN layer or to decrease the Al composition thereof. In this case, the contact resistances Rc between the 2DEG and the source electrode and between the 2DEG and the drain electrode can be reduced. However, the electron concentration of the 2DEG is decreased, and the access resistances Rs and Rd between the source and the gate and between the drain and the gate, respectively, are increased. Hence, the resistance between the source electrode and the drain electrode is increased.

Accordingly, in a GaN HFET, the normally-off characteristic and the reduction in on-resistance are difficult to be achieved at the same time due to the trade-off relationship therebetween. HFETs disclosed in Japanese Unexamined Patent Application Publication Nos. 2004-273486 and 2009-076845 have the problem as described above.

International Publication Nos. WO2007/007548 and WO20091001888 and Japanese Unexamined Patent Application Publication Nos. 2007-073873 and 2008-288474 each have disclosed a FET having a back barrier layer. However, even by this structure, the concentration of the 2DEG is decreased. In addition, by the back barrier layer, the access resistances Rs and Rd are increased.

In consideration of the problems of related techniques as described above, the inventors of the present disclosure have studied in detail the structure of a GaN HFET which can achieve a normally-off characteristic and has a low on-resistance. As a result, it was found that the following three measures are preferably performed.

(1) To realize a normally-off characteristic by a gate layer formed of a p-type semiconductor material having a high hole concentration.

(2) To reduce the channel resistance by decreasing a gate length.

(3) To reduce the access resistance by decreasing the length between the source and the drain electrodes.

Figure 2:
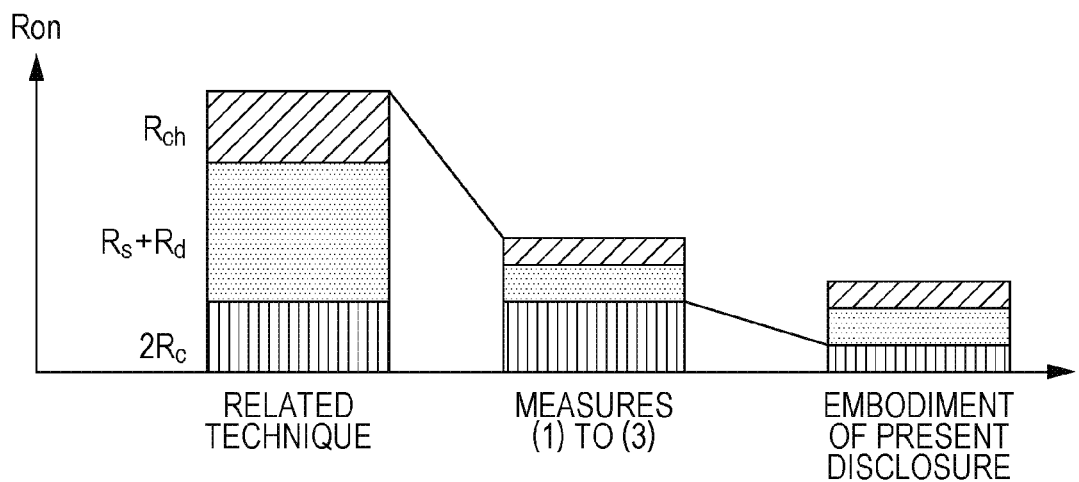
FIG. 2 is a graph showing a component ratio of an on-resistance of each of HFETs having various structures.

FIG. 2 schematically shows the on-resistance of a HFET obtained when the above measures (1) to (3) are performed. As shown in FIG. 2, it was found that the on-resistance of a HFET obtained by the above measures (1) to (3) is primarily formed of the contact resistance component.

Based on the findings as described above, by reducing the contact resistance as schematically shown in FIG. 2, the inventors of the present disclosure have conceived a novel semiconductor device capable of realizing a HFET having a low on-resistance and a normally-off characteristic.

The outlines of a nitride semiconductor device and a method for manufacturing a nitride semiconductor device of the present disclosure are as follows.

[Item 1] A nitride semiconductor device comprises: a substrate; a first nitride semiconductor layer supported by the substrate; a second nitride semiconductor layer which is disposed on the first nitride semiconductor layer and which includes a second nitride semiconductor having a larger bandgap than that of a first nitride semiconductor included in the first nitride semiconductor layer; a source-side nitride semiconductor regrowth layer which is located on a source-side recess region and which includes a third nitride semiconductor containing Ge, the source-side recess region having a first recess which extends through a part of the second nitride semiconductor layer to reach the first nitride semiconductor layer; a source electrode electrically connected to the source-side nitride semiconductor regrowth layer; a drain-side nitride semiconductor regrowth layer which is located on a drain-side recess region and which includes a fourth nitride semiconductor containing Ge, the drain-side recess region located apart from the source-side recess region and having a second recess which extends through another part of the second nitride semiconductor layer to reach the first nitride semiconductor layer; a drain electrode electrically connected to the drain-side nitride semiconductor regrowth layer; a gate electrode located on the second nitride semiconductor layer between the source-side nitride semiconductor regrowth layer and the drain-side nitride semiconductor regrowth layer: a first diffusion layer which is disposed in the first nitride semiconductor layer and which contains Ge diffused from the source-side nitride semiconductor regrowth layer to the first nitride semiconductor layer; and a second diffusion layer which is disposed in the first nitride semiconductor layer and which contains Ge diffused from the drain-side nitride semiconductor regrowth layer to the first nitride semiconductor layer.

According to this structure, at each of a source side and a drain side, the nitride semiconductor regrowth layer formed on the recess region is in contact with the vicinity of the interface between the first nitride semiconductor layer and the second nitride semiconductor layer which is exposed to the side surface of the recess region. Hence, the impurity can be diffused from the nitride semiconductor regrowth layer to the first nitride semiconductor layer, and a low resistant contact with the 2DEG is realized. Accordingly, a nitride semiconductor device having a low on-resistance can be realized. In addition, since the nitride semiconductor regrowth layer is an epitaxially grown layer, the impurity is likely to be diffused from the nitride semiconductor regrowth layer to the lattice-matched first nitride semiconductor layer. Hence, the contact resistance can be effectively reduced.

[Item 2] In the nitride semiconductor device described in Item 1, the source-side nitride semiconductor regrowth layer and the drain-side nitride semiconductor regrowth layer each have a facet which forms an angle of 25° to 35° with the normal of the substrate.

[Item 3] In the nitride semiconductor device described in Item 1 or 2, carrier concentrations of Ge of the source-side nitride semiconductor regrowth layer and Ge of the drain-side nitride semiconductor regrowth layer are each $1\times10^{18}$ to $5\times10^{20}$ cm$^{-3}$.

[Item 4] In the nitride semiconductor device described in any one of Items 1 to 3, impurity concentrations of Ge of the source-side nitride semiconductor regrowth layer and Ge of the drain-side nitride semiconductor regrowth layer are each $1\times10^{19}$ to $1\times10^{22}$ cm$^{-3}$.

[Item 5] The nitride semiconductor device described in any one of Items 1 to 4 further comprises: an insulating passivation layer which covers at least a part of the second nitride semiconductor layer located between the source-side recess region and the drain-side recess region and which has an opening to expose the second nitride semiconductor layer, and the insulating passivation layer includes a nitride passivation layer and an oxide passivation layer located on the nitride passivation layer, and the oxide passivation layer has a thickness of 50 to 700 nm.

[Item 6] In the nitride semiconductor device described in any one of Items 1 to 5, the third nitride semiconductor and the fourth nitride semiconductor each have a composition represented by $Al_yGa_{1-y-z}In_zN$ ($0 \le y \le 0.3$, $0 \le z \le 1$).

[Item 7] In the nitride semiconductor device described in any one of Items 1 to 6, the first nitride semiconductor has a composition represented by $Al_xGa_{1-x}N$ ($0 \le x \le 1$), and the second nitride semiconductor has a composition represented by $Al_yGa_{1-z}In_zN$ ($0 \le y \le 1$, $0 \le z \le 1$).

[Item 8] In the nitride semiconductor device described in any one of Items 1 to 7, the second nitride semiconductor layer includes an AlN layer having a thickness of 0.5 to 4 nm and a semiconductor layer including a fifth nitride semiconductor having a composition represented by $Al_yGa_{1-y-z}In_zN$ ($0 \le y < 1$, $0 \le z \le 1$), and the AlN layer is located between the substrate and the semiconductor layer.

[Item 9] The nitride semiconductor device described in any one of Items 1 to 8 further comprises a gate layer which is located at least between the second nitride semiconductor layer and the gate electrode and includes a p-type metal oxide semiconductor.

By the structure as described above, a nitride semiconductor device having a normally-off characteristic can be realized.

[Item 10] In the nitride semiconductor device described in Item 9, the gate layer covers at least a part of a side surface of the gate electrode.

[Item 11] The nitride semiconductor device described in Item 9 further comprises an insulating passivation layer which covers at least a part of the second nitride semiconductor layer located between the source-side recess region and the drain-side recess region and which has an opening to expose the second nitride semiconductor layer, and at least a part of the gate electrode is located in the opening.

[Item 12] In the nitride semiconductor device described in Item 11, the insulating passivation layer is not in contact with the source electrode, the drain electrode, the source-side nitride semiconductor regrowth layer, and the drain-side nitride semiconductor regrowth layer.

By the structure as described above, since the source-side recess region and the drain-side recess region can be formed by self-aligned process with respect to the gate electrode, the length between the source and the drain can be decreased with high accuracy.

[Item 13] In the nitride semiconductor device described in any one of Items 1 to 12, the second nitride semiconductor has a higher Al composition than that of the first nitride semiconductor.

By the structure as described above, a HFET using the 2DEG can be realized.

[Item 14] In the nitride semiconductor device described in any one of Items 1 to 13, a length between the source electrode and the drain electrode is 5 μm or less.

[Item 15] In the nitride semiconductor device described in any one of Items 9 to 14, the p-type metal oxide semiconductor includes nickel oxide.

[Item 16] In the nitride semiconductor device described in any one of Items 9 to 15, the p-type metal oxide semiconductor has a hole concentration of $5\times10^{15}$ to $1\times10^{19}$ cm$^{-3}$.

[Item 17] In the nitride semiconductor device described in Item 15, the p-type metal oxide semiconductor contains at least one of lithium, sodium, potassium, rubidium, and cesium at a concentration of $1\times10^{17}$ to $1\times10^{21}$ cm$^{-3}$.

[Item 18] In the nitride semiconductor device described in any one of Items 9 to 17, the p-type metal oxide semiconductor has a crystallinity oriented in a (111) direction.

[Item 19] In the nitride semiconductor device described in Item 11 or 12, the gate layer is located on a bottom surface and a side surface of the opening.

[Item 20] In the nitride semiconductor device described in Item 11 or 12, a part of the gate layer is located on an upper portion of the insulating passivation layer.

[Item 21] In the nitride semiconductor device described in any one of Items 1 to 20, a depth of the first recess and a depth of the second recess from the surface of the second nitride semiconductor layer are each 20 to 200 nm.

[Item 22] In the nitride semiconductor device described in any one of Items 1 to 21, the source-side nitride semiconductor regrowth layer and the drain-side nitride semiconductor regrowth layer each have a thickness of 30 to 500 nm.

[Item 23] A method for manufacturing a nitride semiconductor device comprises: preparing a semiconductor structure on a substrate, the structure having a first nitride semiconductor layer supported by the substrate and a second nitride semiconductor layer located on the first nitride semiconductor layer; forming a source-side recess region and a drain-side recess region, each of which is formed by engraving the first nitride semiconductor layer to a predetermined depth through a part of the second nitride semiconductor layer; forming a source-side nitride semiconductor regrowth layer and a drain-side nitride semiconductor regrowth layer, each of which is formed of a nitride semiconductor material containing an n-type impurity at a high concentration, on the source-side recess region and the drain-side recess region, respectively; forming a source electrode and a drain electrode on the source-side nitride semiconductor regrowth layer and the drain-side nitride semiconductor regrowth layer, respectively; forming an insulating passivation layer on the source electrode, the drain electrode, the source-side nitride semiconductor regrowth layer, the drain-side nitride semiconductor regrowth layer, and the second nitride semiconductor layer; forming an opening in the insulating passivation layer to expose a part of the second nitride semiconductor layer; forming a gate layer at least in the opening; and forming a gate electrode on the gate layer.

[Item 24] A method for manufacturing a nitride semiconductor device comprises: preparing a semiconductor structure on a substrate, the structure having a first nitride semiconductor layer supported by the substrate and a second nitride semiconductor layer located on the first nitride semiconductor layer; forming an insulating passivation layer on the second nitride semiconductor layer; forming on the insulating passivation layer, a first mask layer having an opening which exposes a part of the second nitride semiconductor layer and which is to be used as a gate forming region; forming a gate layer in the opening; forming a gate electrode on the gate layer; forming a second mask layer on the gate electrode; etching the insulating passivation layer using the second mask layer as a mask to form a source-side recess region and a drain-side recess region, each of which is formed by engraving the first nitride semiconductor layer to a predetermined depth through a part of the second nitride semiconductor layer; forming a source-side nitride semiconductor regrowth layer and a drain-side nitride semiconductor regrowth layer from a nitride semiconductor material containing an n-type impurity at a high concentration on the source-side recess region and the drain-side recess region, respectively; and forming a source electrode and a drain electrode on the source-side nitride semiconductor regrowth layer and the drain-side nitride semiconductor regrowth layer, respectively.

[Item 25] in the method for manufacturing a nitride semiconductor device described in Item 23 or 24, the gate layer is formed by an atomic layer deposition method.

First Embodiment

Figure 3:
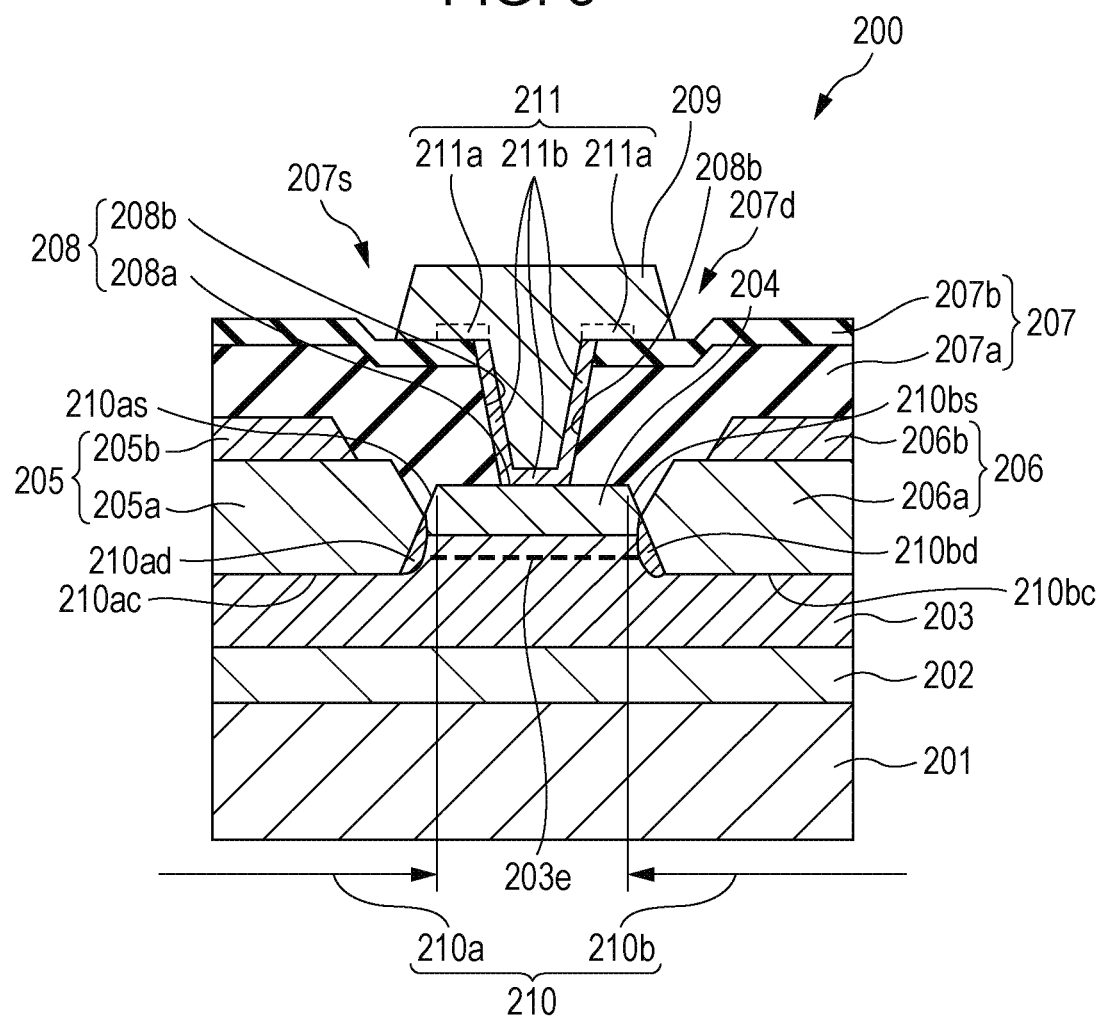
FIG. 3 is a schematic cross-sectional view showing the structure of a nitride semiconductor device according to a first embodiment.

Hereinafter, a nitride semiconductor device of a first embodiment and a method for manufacturing the same will be described. FIG. 3 is a cross-sectional view of a nitride semiconductor device 200 of this embodiment. The nitride semiconductor device 200 includes a substrate 201, a nitride buffer layer 202, a first nitride semiconductor layer 203, a second nitride semiconductor layer 204, a source-side nitride semiconductor regrowth layer 205a, a drain-side nitride semiconductor regrowth layer 206a, a source electrode 205b, a drain electrode 206b, an insulating passivation layer 207, a gate layer 211, and a gate electrode 209. The source-side nitride semiconductor regrowth layer 205a and the source electrode 205b form a composite source electrode 205. The drain-side nitride semiconductor regrowth layer 206a and the drain electrode 206b form a composite drain electrode 206. One example of the nitride semiconductor device 200 is a hetero-junction field effect transistor (HFET). Next, the individual constituent elements of the nitride semiconductor device 200 will be described.

<Substrate 201>

As an example of the material of the substrate 201, silicon, sapphire, or SiC may be mentioned. When the material of the substrate 201 is silicon, sapphire, or SiC, the nitride buffer layer 202, the first nitride semiconductor layer 203, the second nitride semiconductor layer 204, the source-side nitride semiconductor regrowth layer 205a, and the drain-side nitride semiconductor regrowth layer 206a, each of which will be described later, may be formed using a metal organic chemical vapor deposition (MOCVD) method. The substrate 201 has a first surface and a second surface facing the first surface. The first surface of the substrate 201 is a surface in contact with the nitride buffer layer 202 which will be described below.

<Nitride Buffer Layer 202>

The nitride buffer layer 202 is formed on the substrate 201. When the nitride buffer layer 202 is epitaxially grown on the first surface of the substrate 201, the crystal orientation of the surface of the nitride buffer layer 202 in contact with the first surface of the substrate 201 is aligned with the crystal orientation of the first surface of the substrate 201. For example, when the material of the substrate 201 is silicon, and the first surface thereof is the (111) plane, the surface of the nitride buffer layer 202 in contact with the substrate 201 is the (0001) plane. In addition, when the material of the substrate 201 is sapphire, and the first surface thereof is the (0001) plane, the surface of the nitride buffer layer 202 in contact with the substrate 201 is the (0001) plane.

As an example of the material of the nitride buffer layer 202, AlN or AlGaN may be mentioned. The nitride buffer layer 202 may have either a monolayer structure of AlN or AlGaN or a multilayer structure of AlN and AlGaN.

When silicon is used for the substrate 201, the nitride buffer layer 202 can reduce a stress (warpage) present in the first nitride semiconductor layer 203 supported by the substrate 201 and a stress present in the second nitride semiconductor layer 204. When having a multilayer structure containing a plurality of nitride semiconductor layers each having a composition represented by $Al_xGa_{1-x}N$ (0<x<1), the nitride buffer layer 202 can further reduce the stresses present in the first nitride semiconductor layer 203 and the second nitride semiconductor layer 204. In the case described above, the multilayer structure includes a plurality of nitride semiconductor layers having different composition ratios x.

<First Nitride Semiconductor Layer 203>

The first nitride semiconductor layer 203 is formed on the nitride buffer layer 202 and is supported by the substrate 201. Since the first nitride semiconductor layer 203 is epitaxially grown on the nitride buffer layer 202 which is epitaxially grown on the first surface of the substrate 201, the crystal orientation of the surface of the first nitride semiconductor layer 203 in contact with the nitride buffer layer 202 is aligned with the crystal orientation of the first surface of the substrate 201.

For example, when the material of the substrate 201 is silicon, and the first surface thereof is the (111) plane, the surface of the first nitride semiconductor layer 203 in contact with the nitride buffer layer 202 is the (0001) plane. In addition, when the material of the substrate 201 is sapphire, and the first surface thereof is the (0001) plane, the surface of the first nitride semiconductor layer 203 in contact with the nitride buffer layer 202 is the (0001) plane.

As an example of the material of the first nitride semiconductor layer 203, un-doped GaN may be mentioned. In the specification of the present disclosure, the term "un-doped" indicates the case in which an impurity is intentionally not doped. The first nitride semiconductor layer 203 may have a thickness of 0.15 to 5 μm.

<Second Nitride Semiconductor Layer 204>

The second nitride semiconductor layer 204 is formed on the first nitride semiconductor layer 203. On the first surface of the substrate 201, the nitride buffer layer 202 and the first nitride semiconductor layer 203 are epitaxially grown in this order. Since the second nitride semiconductor layer 204 is epitaxially grown on the first nitride semiconductor layer 203 which is epitaxially grown, the crystal orientation of the surface of the second nitride semiconductor layer 204 in contact with the first nitride semiconductor layer 203 is aligned with the crystal orientation of the first surface of the substrate 201.

For example, when the material of the substrate 201 is silicon, and the first surface thereof is the (111) plane, the surface of the second nitride semiconductor layer 204 in contact with the first nitride semiconductor layer 203 is the (0001) plane. In addition, when the material of the substrate 201 is sapphire, and the first surface thereof is the (0001) plane, the surface of the second nitride semiconductor layer 204 in contact with the first nitride semiconductor layer 203 is the (0001) plane.

A nitride semiconductor forming the second nitride semiconductor layer 204 has a large bandgap and a small lattice constant as compared to those of a nitride semiconductor forming the first nitride semiconductor layer 203. As an example of the material of the second nitride semiconductor layer 204, $Al_xIn_yGa_{1-x-y}N$ ($0 \leq x < 1$, $0 \leq y < 1$) may be mentioned. The second nitride semiconductor layer 204 may have a thickness of 10 to 50 nm.

The second nitride semiconductor layer 204 may include an AlN layer having a thickness of 0.5 to 4 nm and a semiconductor layer formed of a nitride semiconductor having a composition represented by $Al_yGa_{1-y-z}In_zN$ ($0 \leq y < 1$, $0 \leq z \leq 1$). In this case, the AlN layer is located between the substrate 201 and the semiconductor layer. That is, the AlN layer is located at a substrate 201 side.

As described later in detail, the upper surface of the second nitride semiconductor layer 204 includes a region in contact with the insulating passivation layer 207 and a region in contact with the gate layer 211. In addition, a source-side recess region 210a and a drain-side recess region 210b are provided, each of which is formed by engraving the first nitride semiconductor layer 203 to a predetermined depth through a part of the second nitride semiconductor layer 204. Hereinafter, the source-side recess region 210a and the drain-side recess region 210b are collectively called simply a recess region 210 in some cases.

A lateral direction region of the second nitride semiconductor layer 204 may have a uniform thickness. In this specification, the term "uniform" of the "uniform thickness" indicates the case in which the thickness is not varied or the case in which the thickness is varied within a range of not more than a minimum thickness that can be controllable by an apparatus forming the second nitride semiconductor layer 204. For example, the controllable minimum thickness is several nanometers.

The lateral direction region of the second nitride semiconductor layer 204 may be formed of materials having the same composition. In this specification, the term "same" of the "same composition" indicates the case in which the compositions are not different from each other or the case in which the compositions are different from each other within a range smaller than a composition range that can be controllable by an apparatus forming the second nitride semiconductor layer 204.

Since the lateral direction region of the second nitride semiconductor layer 204 has the uniform thickness and the same composition, a HFET can be realized without decreasing the concentration of the two-dimensional electron gas (2DEG).

<Composite Source Electrode 205 and Composite Drain Electrode 206>

As described above, the composite source electrode 205 includes the source-side nitride semiconductor regrowth layer 205a and the source electrode 205b. The composite source electrode 205 is located on the source-side recess region 210a formed by engraving the first nitride semiconductor layer 203 to a predetermined depth through a part of the second nitride semiconductor layer 204. The source-side nitride semiconductor regrowth layer 205a is an epitaxially grown layer.

In more particular, the source-side recess region 210a includes a bottom surface 210ac and a side surface 210as. The first nitride semiconductor layer 203 is exposed to the bottom surface 210ac. In addition, to the side surface 210as, the first nitride semiconductor layer 203 and the second nitride semiconductor layer 204 are exposed. The source-side nitride semiconductor regrowth layer 205a is formed so as to be in contact with the bottom surface 210ac and the side surface 210as of the source-side recess region 210a. Hence, the source-side nitride semiconductor regrowth layer 205a is in contact with the first nitride semiconductor layer 203 at the bottom surface 210ac and the side surface 210as. The source-side nitride semiconductor regrowth layer 205a may also be in contact with the second nitride semiconductor layer 204 at the side surface 210as.

The source electrode 205b is located on the source-side nitride semiconductor regrowth layer 205a and is electrically connected thereto by an ohmic contact.

As is the case described above, the composite drain electrode 206 includes the drain-side nitride semiconductor regrowth layer 206a and the drain electrode 206b. The composite drain electrode 206 is located on the drain-side recess region 210b formed by engraving the first nitride semiconductor layer 203 to a predetermined depth through a part of the second nitride semiconductor layer 204. The drain-side nitride semiconductor regrowth layer 206a is an epitaxially grown layer.

In more particular, the drain-side recess region 210b includes a bottom surface 210bc and a side surface 210bs. The first nitride semiconductor layer 203 is exposed to the bottom surface 210bc. In addition, to the side surface 210bs, the first nitride semiconductor layer 203 and the second nitride semiconductor layer 204 are exposed. The drain-side nitride semiconductor regrowth layer 206a is formed so as to be in contact with the bottom surface 210bc and the side surface 210bs of the drain-side recess region 210b. Hence, the drain-side nitride semiconductor regrowth layer 206a is in contact with the first nitride semiconductor layer 203 at the bottom surface 210bc and the side surface 210bs. The drain-side nitride semiconductor regrowth layer 206a may also be in contact with the second nitride semiconductor layer 204 at the side surface 210bs.

The source-side nitride semiconductor regrowth layer 205a and the drain-side nitride semiconductor regrowth layer 206a are each formed of a nitride semiconductor material containing an n-type impurity at a high concentration. Hence, the n-type impurity of the source-side nitride semiconductor regrowth layer 205a is diffused to the first nitride semiconductor layer 203 through the side surface 210as of the source-side recess region 210a, so that a first diffusion layer 210ad is formed. As is the case described above, the n-type impurity of the drain-side nitride semiconductor regrowth layer 206a is diffused to the first nitride semiconductor layer 203 through the side surface 210bs of the drain-side recess region 210b, so that a second diffusion layer 210bd is formed. Accordingly, in the first nitride semiconductor layer 203, a 2DEG 203e formed under the second nitride semiconductor layer 204 is in contact with the first diffusion layer 210ad and the second diffusion layer 210bd, so that the source-side nitride semiconductor regrowth layer 205a and the drain-side nitride semiconductor regrowth layer 206a are each able to form a preferable contact with the 2DEG 203e. In particular, since the source-side nitride semiconductor regrowth layer 205a and the drain-side nitride semiconductor regrowth layer 206a are each an epitaxial layer having a high crystallinity, the n-type impurity of each of the source-side nitride semiconductor regrowth layer 205a and the drain-side nitride semiconductor regrowth layer 206a is likely to be diffused to the first nitride semiconductor layer 203.

Although the decrease in source-drain length by miniaturization of the gate structure will be described later, when the gate structure is miniaturized so as to decrease the source-drain length, the on-resistance is primarily formed of a contact resistance as described above. The reduction in contact resistance is effectively performed by decreasing the bandgap of the second nitride semiconductor layer 204, and in particular, the decrease in Al composition is effective. In addition, the decrease in thickness of the second nitride semiconductor layer 204 is also effective. However, by any one of the methods described above, since the concentration of the two-dimensional electron gas (2DEG) is decreased, the access resistance is unfavorably increased, and as a result, the reduction in on-resistance may not be achieved. Accordingly, a method may be conceived in which an electrode is formed on a recess region located at an electrode forming position so as to obtain a contact through a side surface of the recess region.

Through intensive research carried out by the inventors of the present disclosure, it was found that after the recess region is formed, even if a laminate is formed on this recess region by laminating films of materials, such as titanium (Ti), aluminum (Al), and hafnium (Hf), each having a low contact resistance with an n-type semiconductor layer, a sufficiently low contact resistance cannot be obtained. Accordingly, the inventors of the present disclosure studied a method which can obtain a contact with the 2DEG by diffusion of an impurity material. In particular, in order to perform smooth diffusion of an impurity, the method described below was employed. That is, a material having chemical and physical characteristics similar to those of a material located below the recess region is used, and an impurity material which can be doped at a high concentration and which has a high diffusion coefficient is selected so as to promote the diffusion. From the point as described above, as the n-type impurity contained at a high concentration in the source-side nitride semiconductor regrowth layer 205a and the drain-side nitride semiconductor regrowth layer 206a, germanium (Ge) is selected. Since it is aimed to obtain a contact with the 2DEG by the diffusion of an impurity material, the depth of the recess region may be required so as to enable the 2DEG to appear at a side surface 210as, 210bs of the recess region 210.

In addition, although the details will be described later, the source-side nitride semiconductor regrowth layer 205a and the drain-side nitride semiconductor regrowth layer 206a each tend to grow while having a facet in the vicinity of the <11-01> or the <112-2> direction because of the inherent characteristics thereof. Since this facet ideally forms an angle of 28° with the normal of the semiconductor device, even if the regrowth is simply performed, it is difficult to enable the source-side nitride semiconductor regrowth layer 205a and the drain-side nitride semiconductor regrowth layer 206a to be in contact with the 2DEG at a desired thickness. On the other hand, in the recess region 210, the angle formed between the side surface of the first nitride semiconductor layer 203 and the normal of the semiconductor device is 0° to 20°. Furthermore, when the thickness of each of the source-side nitride semiconductor regrowth layer 205a and the drain-side nitride semiconductor regrowth layer 206a is larger than a predetermined value, cracks may be generated therein, and as a result, no contact may be obtained in some cases.

In consideration of those described above, the inventors of the present disclosure found an appropriate depth of the recess region and an appropriate thickness of each of the source-side nitride semiconductor regrowth layer 205a and the drain-side nitride semiconductor regrowth layer 206a at which a preferable contact with the 2DEG can be achieved.

In particular, in the recess region 210 in the second nitride semiconductor layer 204 and the first nitride semiconductor layer 203 may have a depth of 20 to 200 nm from the surface of the second nitride semiconductor layer 204. In addition, the source-side nitride semiconductor regrowth layer 205a and the drain-side nitride semiconductor regrowth layer 206a each may have a thickness of 30 to 500 nm. Furthermore, the facet of the source-side nitride semiconductor regrowth layer 205a and the facet of the drain-side nitride semiconductor regrowth layer 206a each may form an angle of approximately 30° (such as 30°±5°) with the normal of the semiconductor device. Since the facet of each of the source-side nitride semiconductor regrowth layer 205a and the drain-side nitride semiconductor regrowth layer 206a is a facet in the vicinity of the <11-01> or the <112-2> direction, the angle formed between the facet of each of the source-side nitride semiconductor regrowth layer 205a and the drain-side nitride semiconductor regrowth layer 206a in the vicinity of the <11-01> or the <112-2> direction and the normal of the main surface of the substrate 201 may be approximately 30°. In this case, the "normal of the semiconductor device" means the normal of the substrate 201 and, in more particular, approximately coincides with the direction orthogonal to the first surface of the substrate 201.

In addition, the source electrode 205b and the drain electrode 206b are in contact with the source-side nitride semiconductor regrowth layer 205a and the drain-side nitride semiconductor regrowth layer 206a, respectively. Hence, the nitride semiconductor forming each of the source-side nitride semiconductor regrowth layer 205a and the drain-side nitride semiconductor regrowth layer 206a may have a smaller bandgap than that of the nitride semiconductor forming the second nitride semiconductor layer 204 and furthermore, may have a smaller bandgap than that of the nitride semiconductor forming the first nitride semiconductor layer 203. In particular, the nitride semiconductor forming each of the source-side nitride semiconductor regrowth layer 205a and the drain-side nitride semiconductor regrowth layer 206a may be formed of $Al_yGa_{1-y-z}In_zN$ ($0 \leq y \leq 0.3$, $0 \leq z \leq 1$).

In the recess region 210, the angle formed between the normal of the main surface of the substrate 201 and the side surface of the first nitride semiconductor layer 203, that is, the surface forming the side surface 210*as* or 210*bs* of the recess region 210, is 0° to 20°.

In the recess region 210, the second nitride semiconductor layer 204 withdraws toward a gate layer 211 side, and the length of the first nitride semiconductor layer 203 in a direction parallel to the first surface of the substrate 201 at a portion other than the recess region 210 (portion which is not engraved) located under the gate layer 211 is larger than the length of the second nitride semiconductor layer 204 at the same portion as described above. That is, a part of the first nitride semiconductor layer 203 and a part of the second nitride semiconductor layer 204, which are sandwiched by the source-side recess region 210*a* and the drain-side recess region 210*b*, each have a forward tapered shape.

Figure 4:
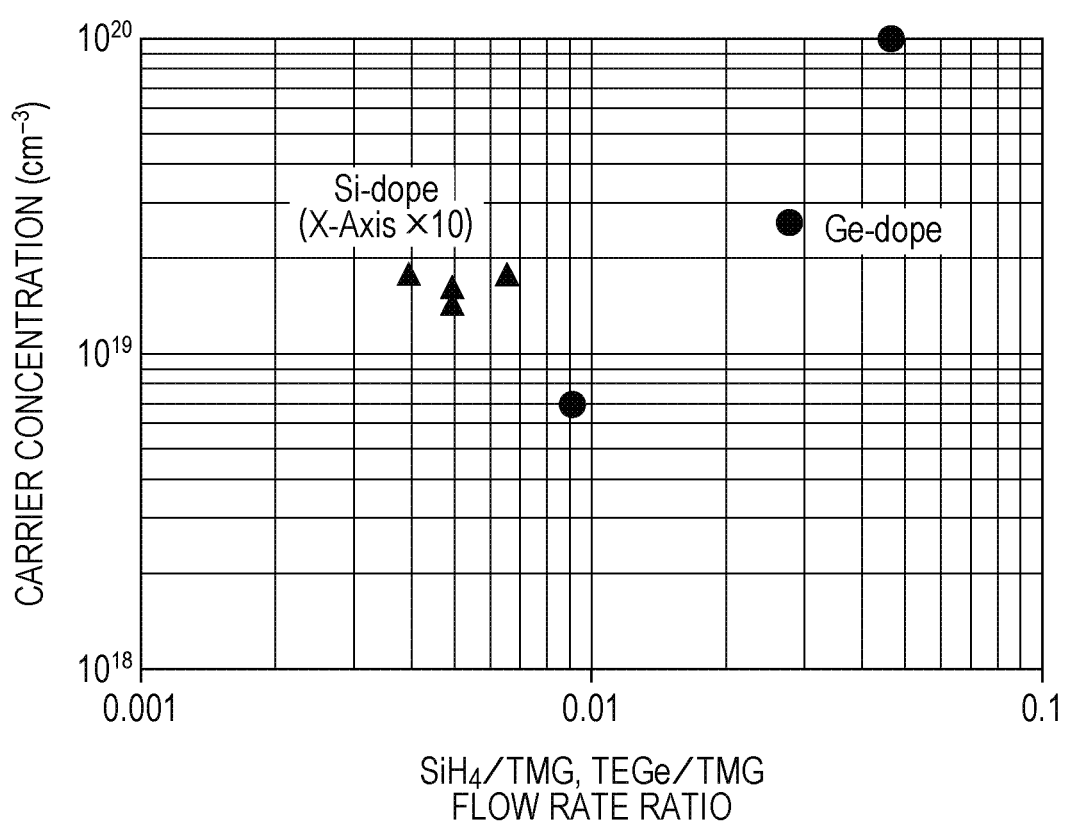
FIG. 4 is a graph showing a carrier concentration of a nitride semiconductor layer with respect to a flow rate ratio of impurity materials.

As described above, the source-side nitride semiconductor regrowth layer 205*a* and the drain-side nitride semiconductor regrowth layer 206*a* each may contain an n-type impurity at a high concentration. However, as shown in FIG. 4, when the impurity is silicon (Si), even if an impurity amount to be supplied during the growth of a nitride semiconductor layer is increased, the carrier concentration of the impurity in the nitride semiconductor layer to be formed is not increased. That is, the impurity carrier concentration has a certain upper limit. On the other hand, when germanium (Ge) is used as the impurity, a higher carrier concentration than that of silicon can be realized.

Figure 5:
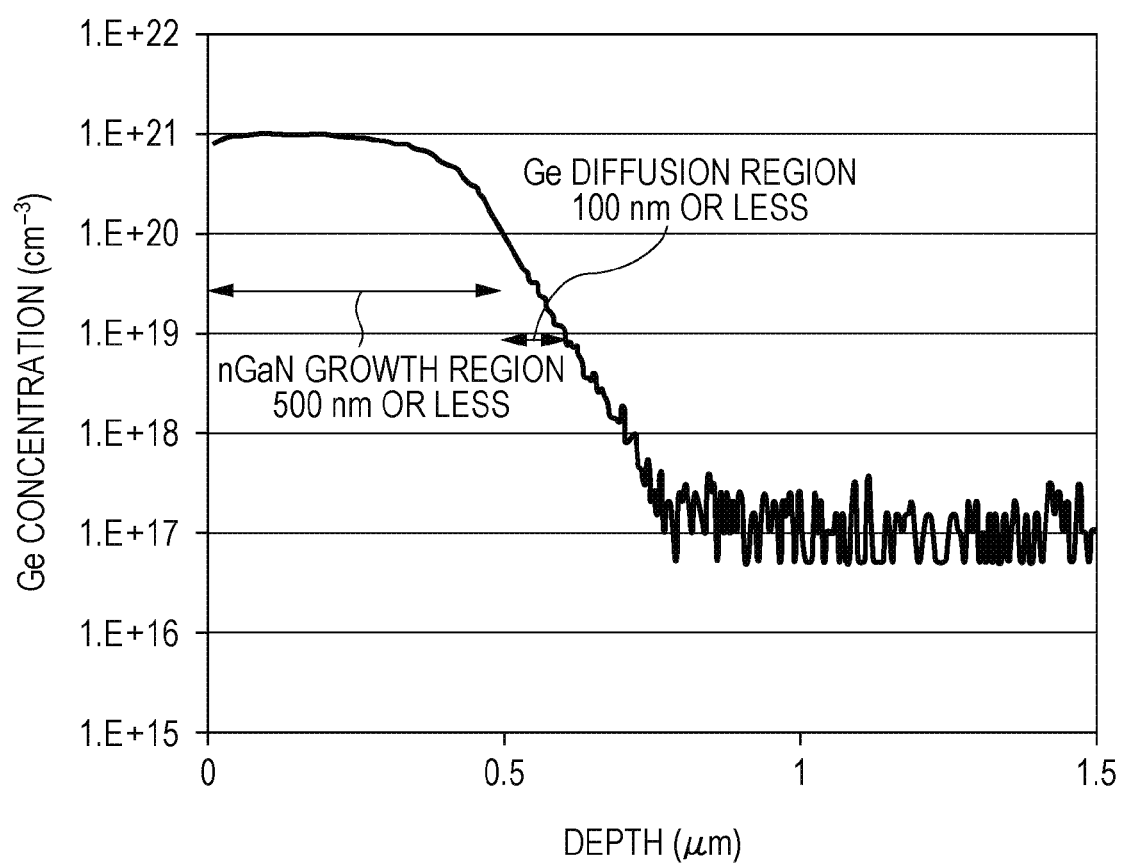
FIG. 5 is a graph showing the diffusion of an impurity from a nitride semiconductor layer.

FIG. 5 is a graph showing the diffusion of Ge in a nitride semiconductor layer. In FIG. 5, the vertical axis represents Ge concentration ($cm^{-3}$), and the horizontal axis represents the depth (μm). As shown in FIG. 5, for example, when Ge is doped in the nitride semiconductor layer at a concentration of $1 \times 10^{21}$ $cm^{-3}$, a diffusion of approximately 100 nm is generated.

From the result described above, the n-type impurity concentration of the source-side nitride semiconductor regrowth layer 205*a* and that of the drain-side nitride semiconductor regrowth layer 206*a* each may be $1 \times 10^{19}$ to $1 \times 10^{22}$ $cm^{-3}$. In addition, the carrier concentration of the n-type impurity in the source-side nitride semiconductor regrowth layer 205*a* and that in the drain-side nitride semiconductor regrowth layer 206*a* each may also be $1 \times 10^{18}$ to $5 \times 10^{20}$ $cm^{-3}$.

The source electrode 205*b* and the drain electrode 206*b* each have a multilayer structure in which, for example, films of titanium (Ti), aluminum (Al), and hafnium (Hf) are laminated to each other. The source electrode 205*b* and the drain electrode 206*b* each may be formed of a material which forms a low contact resistance, that is, an ohmic contact having a low resistance, with an n-type nitride semiconductor layer. For example, vanadium (V), zirconium (Zr), or the like may also be used instead of hafnium (Hf).

The source electrode 205*b* and the drain electrode 206*b* each may have a thickness of 20 to 500 nm and may also have a thickness of 40 to 200 nm.

The length between the source electrode 205*b* and the drain electrode 206*b* may be 5 μm. The source electrode 205*b* and the drain electrode 206*b* may be located apart from each other. In this embodiment, a length of 5 μm or less excludes 0 μm.

<Insulating Protective Layer 207>

The insulating passivation layer 207 covers at least a part of the source electrode 205*b*, a part of the drain electrode 206*b*, a part of the source-side nitride semiconductor regrowth layer 205*a*, a part of the drain-side nitride semiconductor regrowth layer 206*a*, and a part of the second nitride semiconductor layer 204 located between the source-side recess region 210*a* and the drain-side recess region 210*b*. The insulating passivation layer 207 may further cover a part of the side surface 210*as* of the source-side recess region 210*a* and a part of the side surface 210*bs* of the drain-side recess region 210*b*. In addition, the insulating passivation layer 207 includes an opening (through hole) 208 which has a bottom surface 208*a* and a side surface 208*b* and which also exposes the second nitride semiconductor layer 204 through the bottom surface 208*a*. That is, the insulating passivation layer 207 does not cover a part of the upper surface of the second nitride semiconductor layer 204. Since the insulating passivation layer 207 is not formed on a part of the surface of the second nitride semiconductor layer 204, the insulating passivation layer 207 has not a uniform film shape.

The gate layer 211 which will be described below is provided in the opening 208 and is in direct contact with the upper surface of the second nitride semiconductor layer 204.

As an example of the material of the insulating passivation layer 207, silicon nitride (SiNx), silicon oxide ($SiO_x$), or AlN may be mentioned. The insulating passivation layer 207 may have either a monolayer structure or a multilayer structure. Since the insulating passivation layer 207 is in direct contact with the second nitride semiconductor layer 204 in a region other than the opening 208, the surface level of the second nitride semiconductor layer 204 at a portion in contact with the insulating passivation layer 207 is reduced. Accordingly, out of the region of the opening 208, the carrier concentration of the 2DEG 203*e* formed ire the first nitride semiconductor layer 203 and under the interface between the first nitride semiconductor layer 203 and the second nitride semiconductor layer 204 can be increased, so that the on-resistance of the nitride semiconductor device 200 can be reduced.

The insulating passivation layer 207 also functions as a dielectric layer when a positive voltage is applied to the gate electrode 209 which will be described later. As a result, out of the region of the opening 208 on the second nitride semiconductor layer 204, the carrier concentration of the 2DEG formed in the first nitride semiconductor layer 203 can be increased, and the on-resistance of the nitride semiconductor device 200 can be reduced.

The insulating passivation layer 207 may have a thickness of 100 to 500 nm. When having a multilayer structure, for example, the insulating passivation layer 207 includes a nitride passivation layer 207*a* and an oxide passivation layer 207*b* formed thereon, the nitride passivation layer 207*a* covering at least a part of the source electrode 205*b*, a part of the drain electrode 206*b*, a part of the source-side nitride semiconductor regrowth layer 205*a*, a part of the drain-side nitride semiconductor regrowth layer 206*a*, and a part of the second nitride semiconductor layer 204 located between the source-side recess region 210*a* and the drain-side recess region 210*b*. Since the insulating passivation layer 207 includes the nitride passivation layer 207*a*, the adhesion to the second nitride semiconductor layer 204 is improved. In addition, the nitride passivation layer 207*a* has a contribution to the increase in concentration of a 2DEG layer.

The oxide passivation layer 207*b* has a contribution to the improvement in adhesion between the gate layer 211 which will be described below and the gate electrode 209. When the thickness of the oxide passivation layer 207*b* is less than 1 nm, the adhesion between the gate layer 211 and the gate electrode 209 is degraded. In addition, when the thickness of the oxide passivation layer 207*b* is more than 50 nm, the adhesion to the nitride passivation layer 207a is degraded. Hence, the oxide passivation layer 207b may have a thickness of 1 to 50 nm.

In the nitride semiconductor device of this embodiment, since the gate layer 211 and the second nitride semiconductor layer 204 are in direct contact with each other in the opening 208, the insulating protective layer 207 is divided into an insulating passivation layer (source electrode forming region) 207s at a composite source electrode 205 side and an insulating passivation layer (drain electrode forming region) 207d at a composite drain electrode 206 side by the gate layer 211.

<Gate Layer 211>

The gate layer 211 is located at least between the second nitride semiconductor layer 204 and the gate electrode 209 which will be described below. In particular, the gate layer 211 is located in the opening 208 in the insulating passivation layer 207 and is in contact with the second nitride semiconductor layer 204 at the bottom surface 208a of the opening 208. In more particular, the gate layer 211 is formed in contact with the second nitride semiconductor layer 204 between the insulating passivation layer 207s at the source electrode side and the insulating passivation layer 207d at the drain electrode side so as to separate the insulating passivation layer 207s from the insulating passivation layer 207d. The gate layer 211 is formed of a p-type metal oxide semiconductor.

The gate layer 211 includes a region 211a facing the second nitride semiconductor layer 204 with the insulating passivation layer 207s at the source electrode side and the insulating passivation layer 207d at the drain electrode side interposed therebetween and a region 211b located at the bottom surface 208a and the side surface 208b of the opening 208. In view of the capacity reduction, the gate layer 211 may be formed only from the region 211b in contact with the bottom surface 208a and the side surface 208b. However, since the gate layer 211 includes the region 211a, the carrier concentration of the 2DEG layer formed in the vicinity of the interface between the first nitride semiconductor layer 203 and the second nitride semiconductor layer 204 can be increased out of the region of the opening 208. As a result, the nitride semiconductor device 200 can significantly reduce the on-resistance as compared to that of the case in which the gate layer 211 is formed only from the region 211b.

As an example of the material of the gate layer 211, a p-type metal oxide semiconductor may be mentioned. For example, nickel oxide may be used. Since a p-type metal oxide semiconductor is used for the gate layer 211 at a portion of the second nitride semiconductor layer 204 located under the opening 208, the potential of the 2DEG 203e is increased, so that the electrons thereof can be drained (depleted).

In the nitride semiconductor device 200, in order to obtain a normally-off characteristic, the potential of the 2DEG 203e is required to be formed at a position higher than the Fermi level. The height of the potential of the 2DEG 203e can be controlled by the hole concentration of the gate layer 211 and the carrier concentration of the 2DEG 203e. The carrier concentration of the 2DEG 203e is determined by the Al composition and the film thickness of the second nitride semiconductor layer 204. The carrier concentration of the 2DEG 203e calculated by the spontaneous polarization and the piezoelectric polarization is controllable from $7 \times 10^{11}$ to $6 \times 10^{13}$ cm$^{-3}$ by the Al composition. In order to control the potential of the 2DEG 203e, the hole concentration of the gate layer 211 may be $5 \times 10^{15}$ cm$^{-3}$ or more. In addition, in general, a p-type metal oxide semiconductor having a hole concentration of more than $1 \times 10^{19}$ cm$^{-3}$ is difficult to form. Hence, the hole concentration of a p-type metal oxide semiconductor forming the gate layer 211 may be $5 \times 10^{15}$ to $1 \times 10^{19}$ cm$^{-3}$. Furthermore, when the potential of the 2DEG 203e is formed at a higher position than the Fermi level in order to obtain a normally-off characteristic, the hole concentration may be $3 \times 10^{18}$ to $1 \times 10^{19}$ cm$^{-3}$.

A p-type metal oxide semiconductor contains as a p-type impurity, at least one alkali metal selected from the group consisting of lithium, sodium, potassium, rubidium, and cesium. The impurity concentration may be $1 \times 10^{17}$ cm$^{-3}$ or more at which a shallow impurity level capable of obtaining a normally-off characteristic can be formed. In addition, when the doping concentration for hole concentration control is high, since the gate current is increased, the impurity concentration may be $1 \times 10^{21}$ cm$^{-3}$ or less. That is, the p-type impurity concentration of a p-type metal oxide semiconductor may be $1 \times 10^{17}$ to $1 \times 10^{21}$ cm$^{-3}$.

The hole concentration of a p-type metal oxide semiconductor may also be adjusted by cation atom defects or oxygen concentration control.

When the thickness of the gate layer 211 using a p-type metal oxide semiconductor layer is smaller than 30 nm, a normally-off characteristic may not be preferably obtained. In addition, when the thickness of the gate layer 211 described above is more than 200 nm, switching characteristics are degraded. Hence, the gate layer 211 may have a thickness of 30 to 200 nm.

<Gate Electrode 209>

The gate electrode 209 is formed so as to cover a part of the upper surface of the insulating passivation layer 207 and the entire upper surface of the gate layer 211. As an example of the material of the gate electrode 209, chromium (Cr), nickel (Ni), palladium (Pd), gold (Au), and platinum (Pt) may be mentioned. The gate electrode 209 forms a preferable ohmic contact with the gate layer 211. The gate electrode 209 may have either a monolayer structure or a multilayer structure. The gate electrode 209 may have a thickness of 20 to 1,000 nm or may also have a thickness of 40 to 500 nm.

<Manufacturing Method>

Hereinafter, one example of a method for manufacturing the nitride semiconductor device 200 according to this embodiment will be described.

Figure 6A:
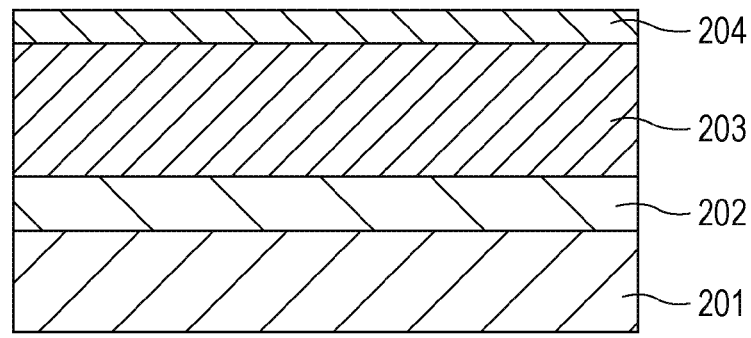
FIG. 6A is a cross-sectional view showing a step of a method for manufacturing the nitride semiconductor device according to the first embodiment.

FIGS. 6A to 6G are each a cross-sectional view showing a step of a method for manufacturing the nitride semiconductor device 200. First, as shown in FIG. 6A, by the use of a crystal growth apparatus, the nitride buffer layer 202, the first nitride semiconductor layer 203, and the second nitride semiconductor layer 204, each of which is formed of a nitride semiconductor, are grown in this order on the substrate 201 formed of silicon or the like. In particular, for example, the first surface of the substrate 201 formed of silicon is cleaned with a buffered hydrofluoric acid, so that a native oxide film on the first surface is removed. Subsequently, the substrate 201 is set in a crystal growth apparatus. As the crystal growth apparatus, an apparatus capable of forming a high quality nitride semiconductor is preferable, and for example, a molecular beam epitaxy (MBE) method, a metal-organic vapor phase epitaxy (MOVPE) method, a metal-organic chemical vapor deposition (MOCVD) method, or a hydride vapor phase epitaxy (HVPE) method may be used. In this embodiment, a MOCVD method will be described by way of example.

By the use of a crystal growth apparatus, the nitride buffer layer 202 is formed. The nitride buffer layer 202 is formed of a nitride semiconductor having a composition represented by $Al_xGa_{1-x}N$ (where $0 \leq x \leq 1$). In this embodiment, for the nitride buffer layer 202, aluminum nitride (AlN) and aluminum gallium nitride (AlGaN) are used. For example, after an AlN layer having a thickness of 0.16 atm is formed, an $Al_{0.5}Ga_{0.5}N$ layer having a thickness of 0.2 μm is formed.

Next, on the nitride buffer layer 202, for example, an un-doped GaN layer having a thickness of 500 nm is formed as the first nitride semiconductor layer 203. Furthermore, on the first nitride semiconductor layer 203, for example, an un-doped $Al_{0.3}Ga_{0.7}N$ layer having a thickness of approximately 15 nm is formed as the second nitride semiconductor layer 204. After those nitride semiconductor layers are sequentially grown, the substrate 201 is recovered from the crystal growth apparatus. Accordingly, a semiconductor structure including the first nitride semiconductor layer 203 supported on the substrate 201 and the second nitride semiconductor layer 204 located on the first nitride semiconductor layer 203 is obtained. The semiconductor structure thus prepared may be used in this embodiment.

Subsequently, a $SiO_2$ film is formed on the second nitride semiconductor layer 204. Furthermore, a resist layer covering a region other than the regions in which the composite source electrode 205 and the composite drain electrode 206 are formed is formed by patterning. As an apparatus forming a $SiO_2$ film, an apparatus capable of forming a high quality insulating film is preferable, and for example, a MBE method, a MOVPE method, a MOCVD method, a plasma CVD (PCVD) method, or a sputtering method may be used.

Next, the $SiO_2$ film is etched by using the resist layer as a mask. For the etching of the $SiO_2$ film, dry etching using a gas or a wet etching with UV irradiation using a buffered hydrofluoric acid or a potassium hydroxide solution may be used. For example, a dry etching method using inductive coupled plasma (hereinafter referred to as "ICP") or the like is used with a tetrafluoromethane ($CF_4$) gas, a trifluoromethane ($CHF_3$) gas, and an oxygen gas as an etching gas. Accordingly, as shown in FIG. 63, a $SiO_2$ film 220 is formed.

Subsequently, the recess region 210 is formed. By the use of the $SiO_2$ film 220 as a mask, the second nitride semiconductor layer 204 and the first nitride semiconductor layer 203 are partially removed by etching, so that the recess region 210 is formed. The depth of the recess region 210 may be 20 to 200 nm from the surface of the second nitride semiconductor layer 204. In addition, in the recess region 210, the side surfaces 210as and 210bs at which the first nitride semiconductor layer 203 and the second nitride semiconductor layer 204 are exposed may form an angle of 0° to 20° with the normal of the semiconductor device.

The etching may be performed by dry etching. For example, the formation of the recess region 210 in the second nitride semiconductor layer 204 and the first nitride semiconductor layer 203 may be performed by a dry etching method using ICP or the like with a chlorine (Cl) gas as an etching gas. The depth of the recess region 210 may be controlled by adjusting the time of dry etching. In addition, the angle between the normal of the semiconductor device and each of the side surfaces 210as and 210bs can be controlled by adjusting etching conditions, such as an etching gas pressure and a bias voltage.

Figure 6B:
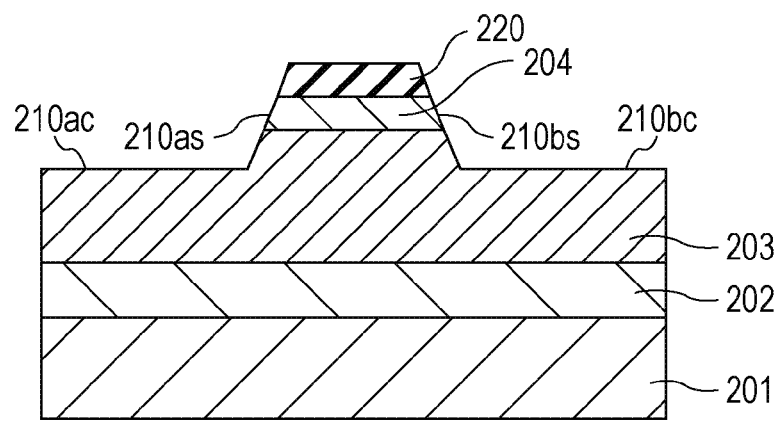
FIG. 6B is a cross-sectional view showing another step of the method for manufacturing the nitride semiconductor device according to the first embodiment.
Figure 6C:
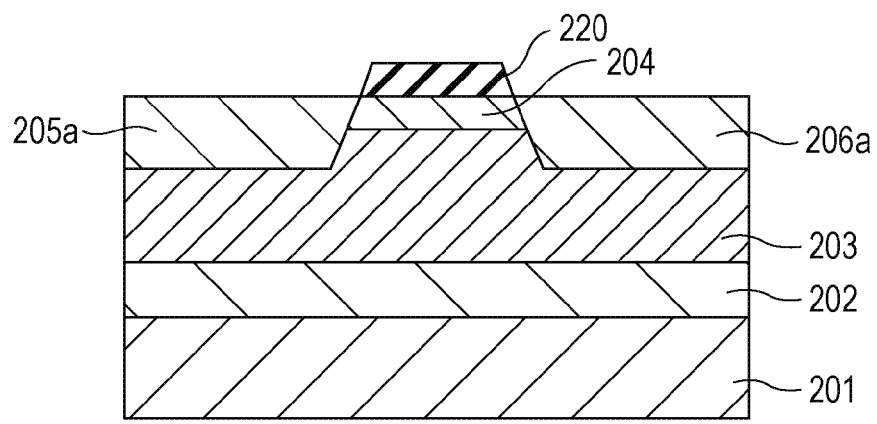
FIG. 6C is a cross-sectional view showing another step of the method for manufacturing the nitride semiconductor device according to the first embodiment.

After the recess region 210 is formed in the second nitride semiconductor layer 204 and the first nitride semiconductor layer 203, the resist layer (not shown) is peeled away. Accordingly, as shown in FIG. 6B, the $SiO_2$ layer 220 remains as a mask, and the recess region 210 is formed in the second nitride semiconductor layer 204 and the first nitride semiconductor layer 203.

Next, the substrate 201 having the structure as described above is again set in a crystal growth apparatus, and a nitride semiconductor regrowth layer is formed. In this step, the $SiO_2$ layer 220 also functions as a mask for regrowth layer formation, and hence the nitride semiconductor regrowth layer is only formed on the recess region 210.

As described above, when the source-side nitride semiconductor regrowth layer 205a and the drain-side nitride semiconductor regrowth layer 206a are formed on the recess region 210 by MOCVD, since a growth rate in the <11-01> direction or the <112-2> direction is higher than that in the <0001> direction, before the growth proceeds in the <0001> direction, the growth proceeds in the <11-01> direction or the <112-2> direction, so that the regrowth layers 205a and 206a are grown while having a facet in the vicinity of the <11-01> direction or the <112-2> direction. Since this facet ideally forms an angle of 28° with the normal of the semiconductor device, even if the source-side nitride semiconductor regrowth layer 205a and the drain-side nitride semiconductor regrowth layer 206a are simply grown, the thicknesses thereof are not increased in the normal direction of the substrate 201, so that the contact of the regrowth layers 205a and 206a with the 2DEG 203e will not occur.

On the other hand, when the thickness of the source-side nitride semiconductor regrowth layer 205a and the thickness of the drain-side nitride semiconductor regrowth layer 206a are excessively large, cracks are formed therein, so that a preferable contact with the first nitride semiconductor layer 203 may not be obtained. The reason for this is a phenomenon generated by the difference in lattice constant between the buffer layer 202 and each of the source-side nitride semiconductor regrowth layer 205a and the drain-side nitride semiconductor regrowth layer 206a, and when the thicknesses thereof are each 500 nm or more, cracks are liable to be formed.

Hence, the depth of the recess region 210 and the thickness of each of the source-side nitride semiconductor regrowth layer 205a and the drain-side nitride semiconductor regrowth layer 206a are determined so that the regrowth layers 205a and 206a are able to be in contact at the side surfaces 210as and 210bs with the 2DEG 203e formed in the first nitride semiconductor layer 203.

In particular, the source-side nitride semiconductor regrowth layer 205a and the drain-side nitride semiconductor regrowth layer 206a each may have a thickness of 30 to 500 nm. In addition, the facet of each of the source-side nitride semiconductor regrowth layer 205a and the drain-side nitride semiconductor regrowth layer 206a may form an angle of approximately 30° with the normal of the semiconductor device.

By the reason described above, the nitride semiconductor forming the source-side nitride semiconductor regrowth layer 205a and the drain-side nitride semiconductor regrowth layer 206a may have a composition represented by $Al_yGa_{1-y-z}In_zN$ ($0 \leq y \leq 0.3$, $0 \leq z \leq 1$). In addition, the concentration of an impurity gas used in MOCVD is adjusted so that the n-type impurity concentration of each of the source-side nitride semiconductor regrowth layer 205a and the drain-side nitride semiconductor regrowth layer 206a is, for example, in a range of $1 \times 10^{19}$ to $1 \times 10^{22}$ cm$^{-3}$. As the impurity gas, for example, triethylgermnaniumn (TEGe) may be used. The thicknesses of the source-side nitride semiconductor regrowth layer 205a and the drain-side nitride semiconductor regrowth layer 206a can be controlled by the growth time therefor. By the reason described above, as long as the source-side nitride semiconductor regrowth layer 205a and the drain-side nitride semiconductor regrowth layer 206a are epitaxially grown, the angle between the facet of each of the source-side nitride semiconductor regrowth layer 205a and the drain-side nitride semiconductor regrowth layer 206a and the normal of the semiconductor device is approximately 30°. When the angle is out of the range described above, the source-side nitride semiconductor regrowth layer 205a and the drain-side nitride semiconductor regrowth layer 206a may not have an excellent crystallinity in some cases. Hence, by adjusting the formation conditions, such as the flow rate of a raw material gas and the growth temperature, the angle formed between the normal of the semiconductor device and the facet of each of the source-side nitride semiconductor regrowth layer 205a and the drain-side nitride semiconductor regrowth layer 206a, which are to be grown, is controlled in the range described above.

By the steps described above, as shown in FIG. 6C, the source-side nitride semiconductor regrowth layer 205a and the drain-side nitride semiconductor regrowth layer 206a are formed on the source-side recess region 210a and the drain-side recess region 210b, respectively.

Next, the $SiO_2$ film 220 used as a mask in the regrowth is removed by wet etching with UV irradiation using a buffered hydrofluoric acid or a potassium hydroxide solution.

Subsequently, by a lithography method, a resist layer (not shown) is formed having openings in regions in which the source electrode 205b and the drain electrode 206b are formed. By a vapor deposition apparatus, ohmic-electrode metal films of Ti, Al, and Hf having thicknesses of 20, 400, and 20 nm, respectively, are formed on the resist layer and parts of the source-side nitride semiconductor regrowth layer 205a and the drain-side nitride semiconductor regrowth layer 206a, each of which is exposed through the resist layer. Subsequently, by a lift-off method, the resist layer and unnecessary portions of the ohmic-electrode metal films provided thereon are removed, so that as shown in FIG. 6O, the source electrode 205b and the drain electrode 206b are formed. Accordingly, the composite source electrode 205 and the composite drain electrode 206 are formed.

Figure 6D:
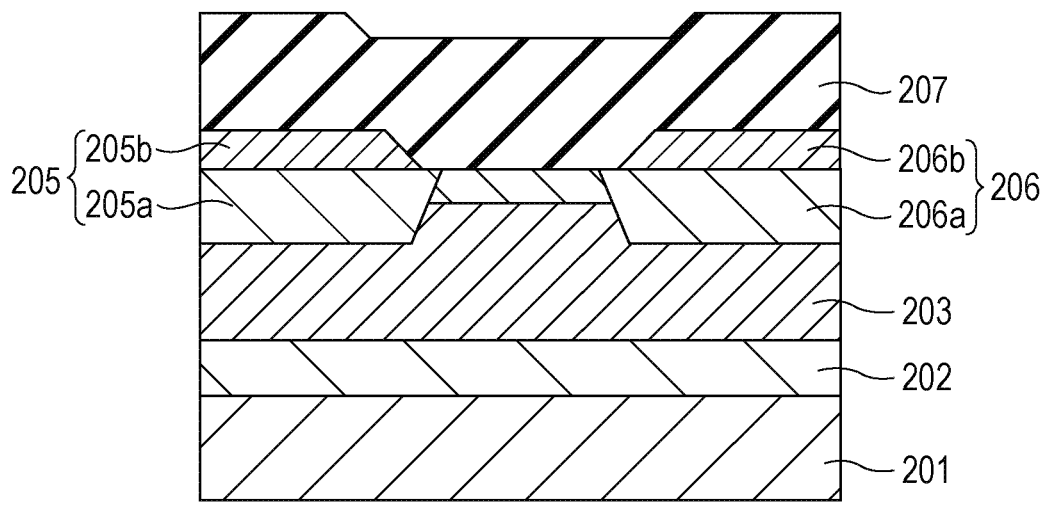
FIG. 6D is a cross-sectional view showing another step of the method for manufacturing the nitride semiconductor device according to the first embodiment.

Next, as shown in FIG. 6D, the insulating passivation layer 207 which covers all the second nitride semiconductor layer 204, the composite source electrode 205, and the composite drain electrode 206 is formed. The insulating passivation layer 207 is formed, for example, of silicon nitride (SiNx) and has a thickness of 300 nm. When the adhesion is important, for example, a dual-layered insulating passivation layer 207 including a silicon nitride (SiNx) layer having a thickness of 300 nm and a silicon oxide ($SiO_x$) layer having a thickness of 10 nm may be formed. As an apparatus forming the insulating passivation layer 207, an apparatus capable of forming a high quality insulating passivation layer 207 is preferable, and a film forming apparatus by a MBE method, a MOVPE method, a MOCVD method, a plasma CVD (PCVD) method, a sputtering method, or the like may be used. In order to suppress the current collapse and to reduce the on-resistance, the insulating passivation layer 207 may be formed by a plasma CVD method.

Figure 6E:
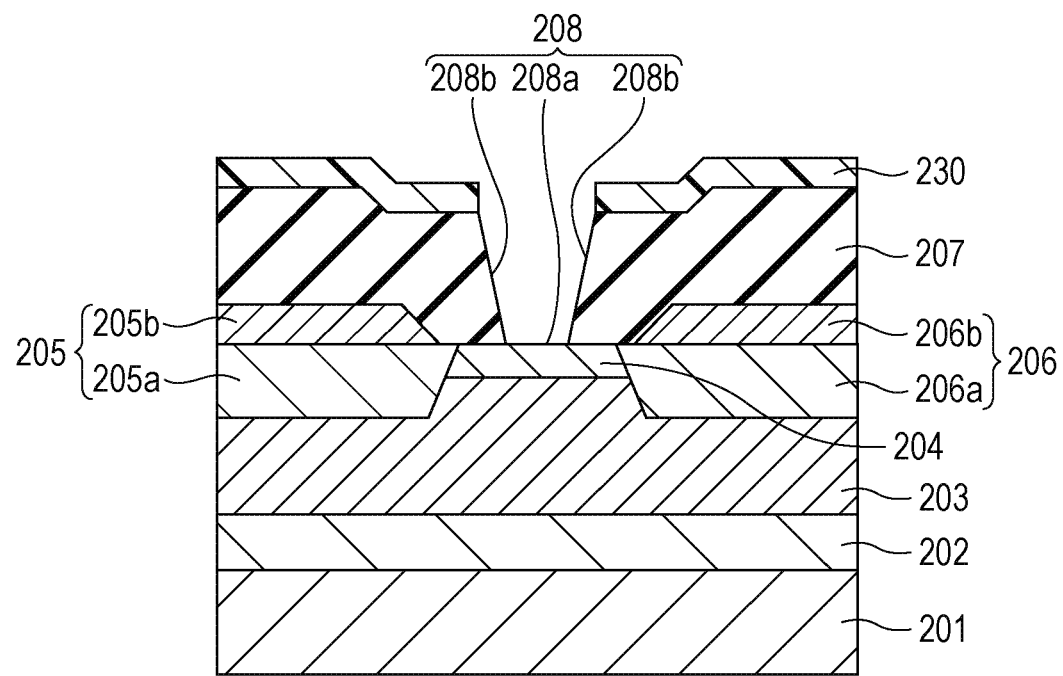
FIG. 6E is a cross-sectional view showing another step of the method for manufacturing the nitride semiconductor device according to the first embodiment.

Next, as shown in FIG. 6E, by a lithography method, a resist layer 230 is formed having an opening in a region in which the gate layer 211 is formed between the composite source electrode 205 and the composite drain electrode 206. By etching of the insulating passivation layer 207 using the resist layer 230 as a mask, the opening 208 is formed in the insulating passivation layer 207. The opening 208 has the bottom surface 208a formed by the second nitride semiconductor layer 204 and the side surface 208b formed by the insulating passivation layer 207. For etching of the insulating passivation layer 207, for example, dry etching using a gas or a wet etching with UV irradiation using a buffered hydrofluoric acid or a potassium hydroxide solution may be used. For example, the opening 208 may be formed by dry etching using ICP or the like with a tetrafluoromethane ($CF_4$) gas, a trifluoromethane ($CHF_3$) gas, and an oxygen gas as an etching gas. When the gate length is decreased, the on-resistance can be reduced. The gate length may be 2 μm or less or may also be 1 μm or less.

Figure 6F:
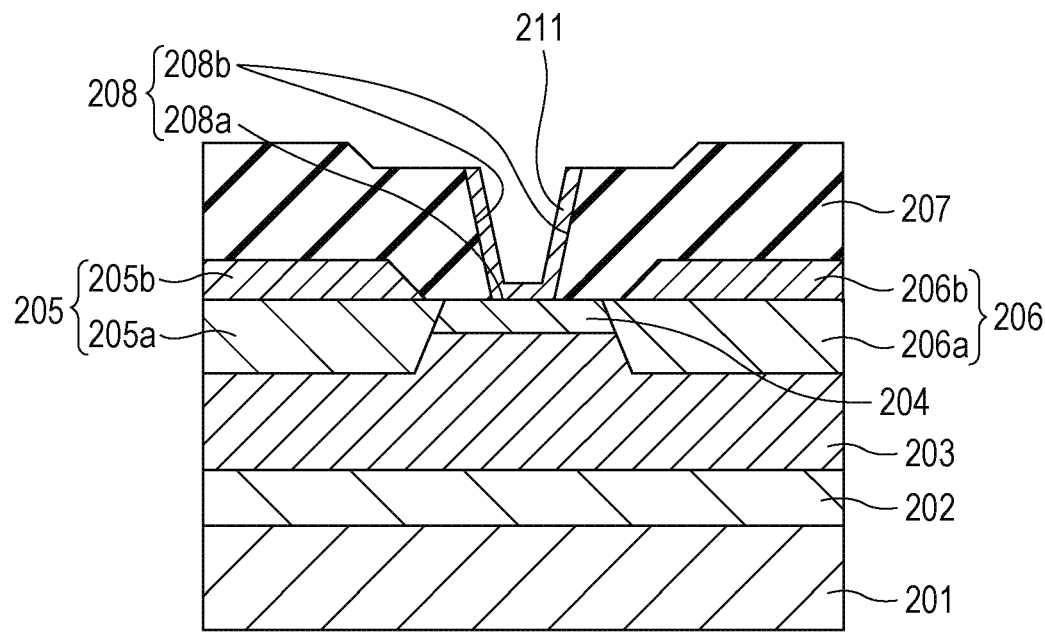
FIG. 6F is a cross-sectional view showing another step of the method for manufacturing the nitride semiconductor device according to the first embodiment.
Figure 6G:
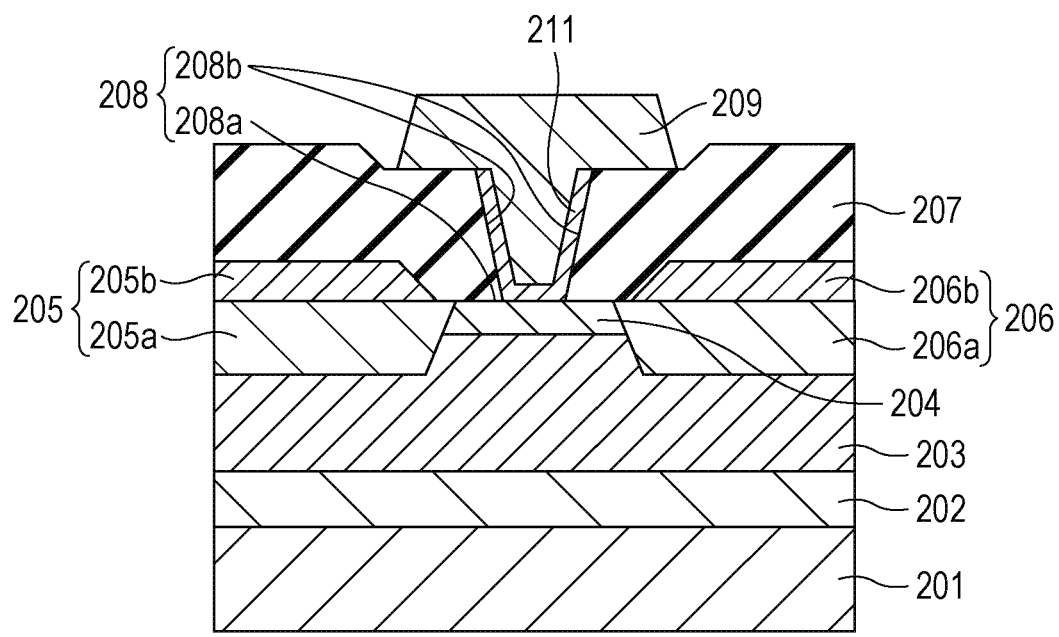
FIG. 6G is a cross-sectional view showing another step of the method for manufacturing the nitride semiconductor device according to the first embodiment.

Next, as shown in FIG. 6F, the gate layer 211 is formed so as to be in contact with the bottom surface 208a and the side surface 208b of the opening 208 provided in the insulating passivation layer 207. The gate layer 211 is formed of a p-type metal oxide semiconductor. For example, as the gate layer 211, a NiO layer having a thickness of 50 nm is formed. When the patterning of the resist layer 230 and the etching conditions of the insulating passivation layer 207 are appropriately selected, a p-type metal oxide semiconductor can be formed not only in the opening 208 but also on an upper portion (periphery of the opening 208 on the insulating passivation layer 207) of the insulating passivation layer 207 facing the second nitride semiconductor layer 204.

The formation of the gate layer 211 of a p-type metal oxide semiconductor may be performed using an atomic layer deposition (ALD) method. By the use of an ALD method, a p-type metal oxide semiconductor layer having a higher hole concentration than that of related AlGaN to which a p-type impurity is doped can be easily obtained. In addition, the gate layer 211 can be formed so as to have a crystallinity oriented in the (111) direction and a uniform thickness. Furthermore, even in a concave structure having an opening dimension of 1 μm or less, a p-type metal oxide semiconductor layer can be formed so that the thickness on the bottom surface is not changed from that on the side surface, that is, a p-type metal oxide semiconductor layer can be formed to have a uniform thickness on the bottom surface 208a and the side surface 208b in the opening 208 without causing any variation in thickness. Hence, miniaturization of the gate structure can be realized. Furthermore, compared to related AlGaN to which a p-type impurity is doped, since the gate layer 211 can be formed at a low temperature, damage done to the semiconductor device can be reduced. In addition, in order to increase the hole concentration of the p-type metal oxide semiconductor layer, a heat treatment may be performed after the formation thereof. Subsequently, by a lift-off method, the resist layer and an unnecessary portion of the gate layer 211 provided thereon are removed, so that the structure shown in FIG. 6G can be obtained.

Next, by a lithography method, on the insulating passivation layer 207 and the gate layer 211, a resist layer (not shown) is formed having an opening at an upper portion of a region in which the gate electrode 209 is formed. By a vapor deposition apparatus, a p-type ohmic-electrode metal film is formed on the resist layer including the gate layer 211 exposed therethrough. Subsequently, by a lift-off method, the resist layer and an unnecessary portion of the p-type ohmic electrode metal film provided thereon are removed, so that the gate electrode 209 is formed.

Next, the insulating passivation layer 207 is partially removed by dry etching to form openings which exposes the source electrode 205b and the drain electrode 206b for electrical contact. As long as the openings are formed so as to expose the source electrode 205b and the drain electrode 206b for electrical contact, the shape of the opening, in particular, the cross-sectional shape thereof, is not specifically limited, and hence, openings may be performed by wet etching using a hydrofluoric acid or the like.

By the manufacturing method described above, the nitride semiconductor device 200 can be manufactured.

Figure 7:
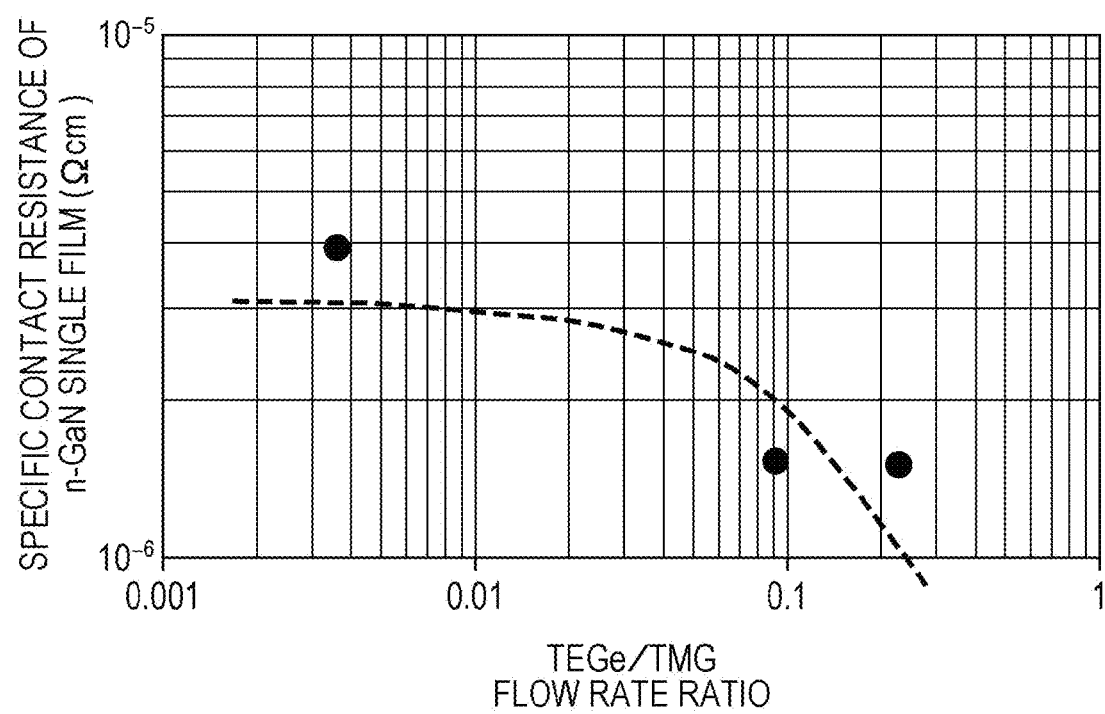
FIG. 7 is a graph showing a sheet resistance of a nitride semiconductor regrowth layer with respect to a flow rate ratio of impurity materials.

In order to investigate the characteristics of the composite electrode of the nitride semiconductor device 200 thus formed, the sheet resistance of the nitride semiconductor regrowth layer itself and the contact resistance thereof with the 2DEG were measured by a transmission line measurement (TLM) method. FIG. 7 shows the relationship between the sheet resistance of the nitride semiconductor regrowth layer itself and the supply amount of Ge. It was found that when the flow rate ratio of TEGe to TMG is increased to 0.09 or more with an increase in supply amount of TEGe, a nitride semiconductor regrowth layer having a lowered sheet resistant of approximately $1.5 \times 10^{-6}$ Ω·cm can be obtained. It was found that when a nitride semiconductor regrowth layer formed under the conditions described above is used, the nitride semiconductor device 200 has a contact resistance of 1 to $5 \times 10^{-6}$ Ω·cm, and a preferable contact with the 2DEG can be obtained.

Figure 8:
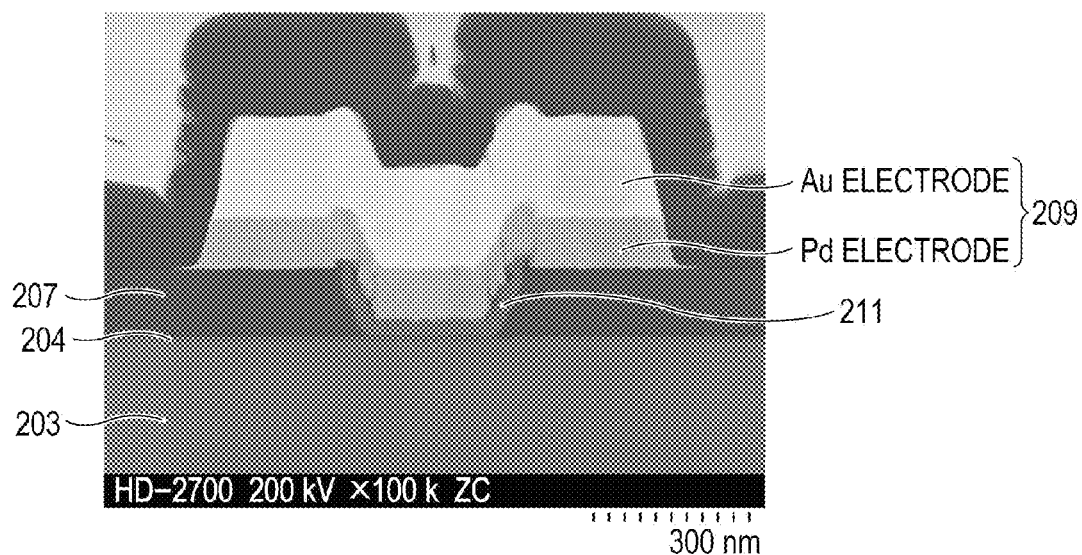
FIG. 8 is a cross-sectional TEM image showing a gate structure of the nitride semiconductor device according to the first embodiment in which MO is used for a gate layer.

FIG. 8 shows a cross-sectional TEM image in the vicinity of a gate electrode of a nitride semiconductor device 200 which is formed by patterning the gate layer 211 using a lift-off method and performing selective growth of a MO layer by an ALD method. From FIG. 8, it was found that the gate layer 211 is formed with a small variation in thickness in an intended region.

Figure 9:
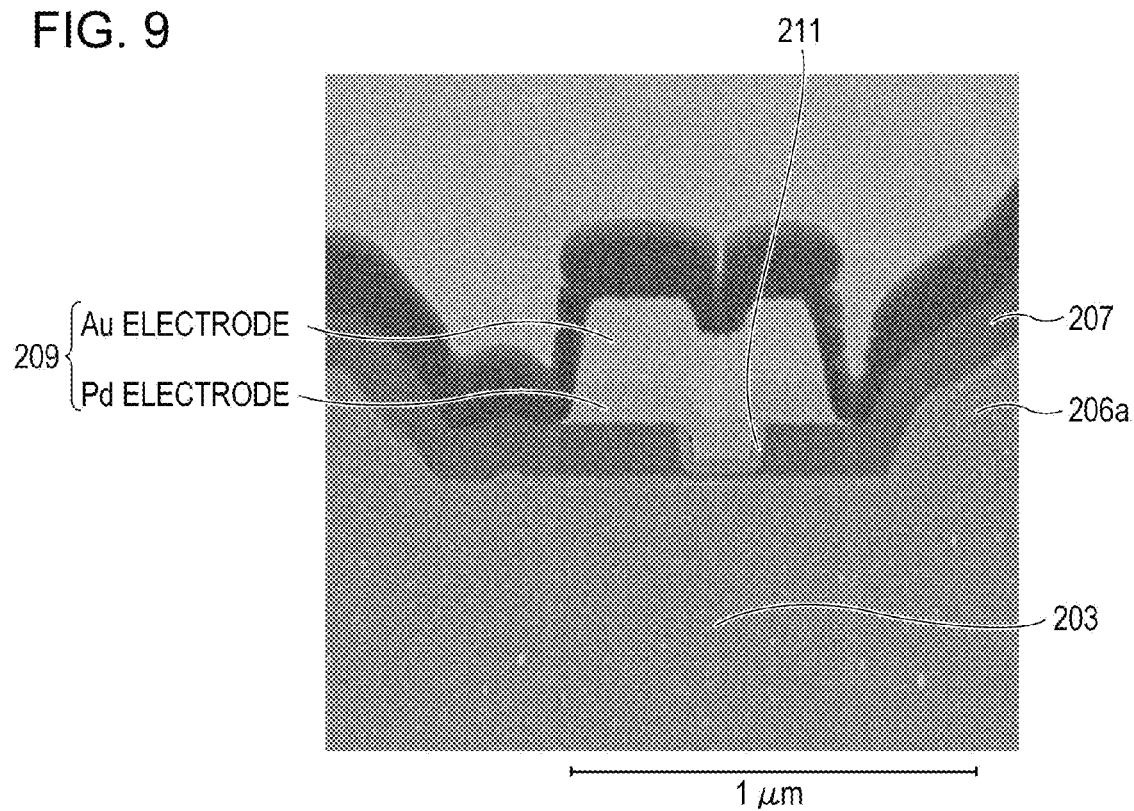
FIG. 9 is a cross-sectional SEM image showing the gate structure of the nitride semiconductor device according to the first embodiment in which MO is used for a gate layer.

FIG. 9 shows a cross-sectional SEM image of a nitride semiconductor device 200 formed in a manner similar to that described above. It was found that as described above, by the regrowth, the nitride semiconductor regrowth layer is formed on the recess region without forming any spaces therebetween, and the nitride semiconductor regrowth layer is physically in contact with the side surface of the recess region.

Figure 10:
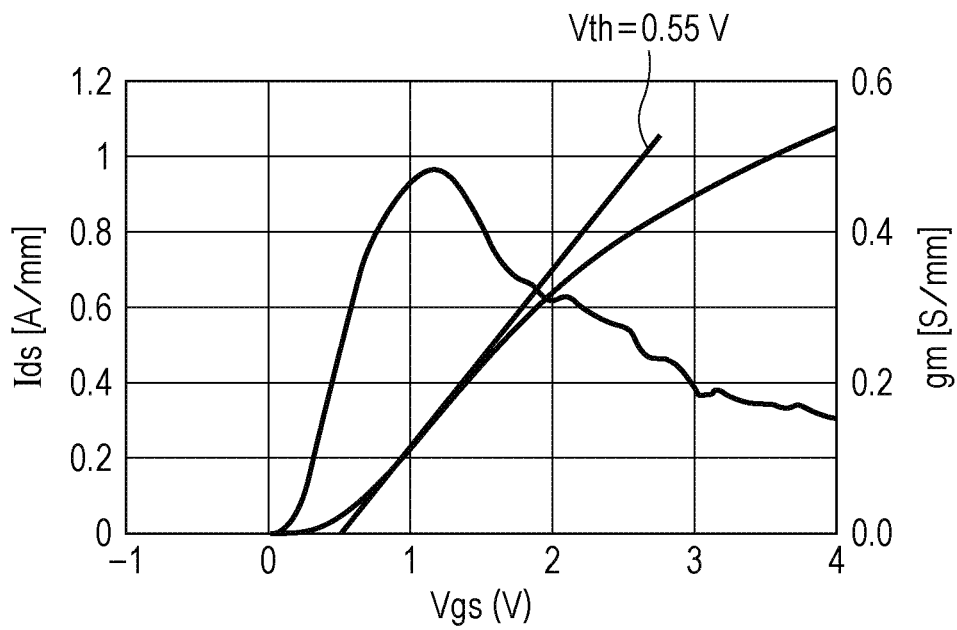
FIG. 10 is a graph showing one example of the relationship between a gate-source voltage Vgs and a drain-source current Ids of the nitride semiconductor device according to the first embodiment.

FIG. 10 shows the relationship between a gate-source voltage Vgs and a drain-source current Ids of a nitride semiconductor device 200 which includes a gate layer 211 formed of MO, a source-side nitride semiconductor regrowth layer 205a, and a drain-side nitride semiconductor regrowth layer 206a, each regrowth layer having a Ge impurity concentration of $1 \times 10^{21}$ cm$^{-3}$. From the result of Ids-Vgs measurement, it was found that preferable transistor characteristics in which a current Ids flows by application of a positive bias Vgs can be obtained. In addition, it was also found that the threshold voltage (Vth) of the nitride semiconductor device 200 is 0.55 V, and a normally-off characteristic is obtained.

Figure 11:
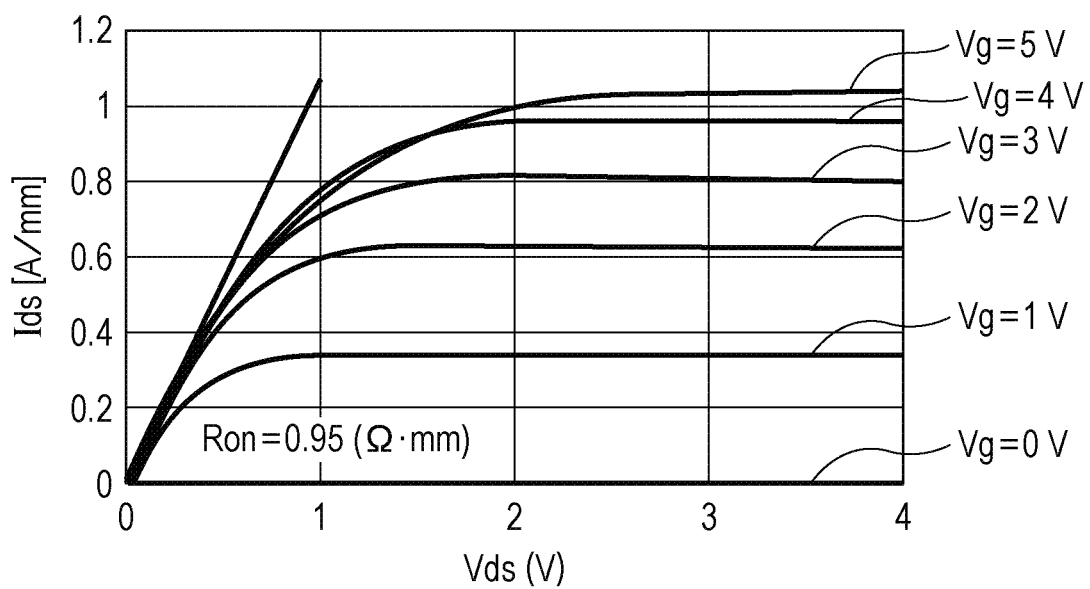
FIG. 11 is a graph showing one example of the relationship between a source-drain voltage Vds and the drain-source current Ids of the nitride semiconductor device according to the first embodiment.

FIG. 11 shows the relationship between a source-drain voltage Vds and the drain-source current Ids of the same nitride semiconductor device 200. From the result of Ids-Vds measurement, it was found that the on-resistance is 0.95 Ω·mm, and the maximum current is 1.1 A/mm. From the results described above, it was found that, in the nitride semiconductor device 200, a normally-off characteristic and a low on-resistance can be simultaneously realized.

Figure 12:
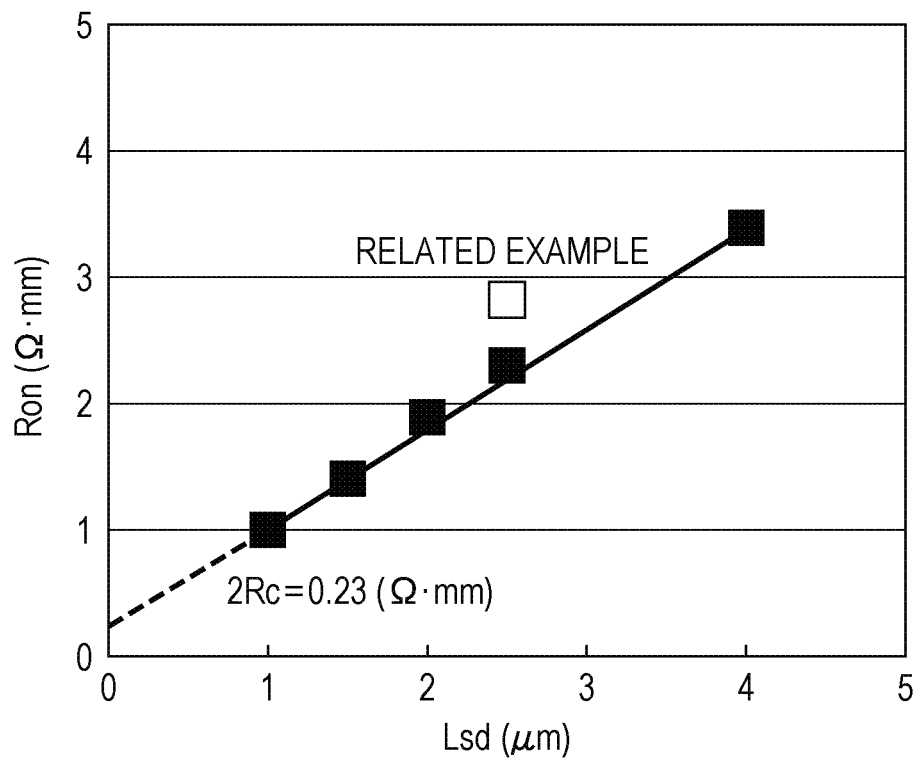
FIG. 12 is a graph showing one example of the relationship between a source-drain length Lsd and an on-resistance Ron of the nitride semiconductor device according to the first embodiment.

FIG. 12 shows the relationship between a source-drain length Lsd and an on-resistance Ron of the nitride semiconductor device 200. After a plurality of nitride semiconductor devices 200 having different Lsd's were formed, the Ron was plotted with the Lsd, and the intercept with the Y axis was obtained, so that the contact resistance 2Rc was obtained. The intercept 2Rc with the Y axis was 0.23 Ω·mm. This value is a significantly small value as compared to 1.5 Ω·mm (2Rc obtained from a related example in a manner similar to that described above) obtained from a related electrode structure. From the results described above, it was found that a preferable contact resistance can be realized.

Figure 13:
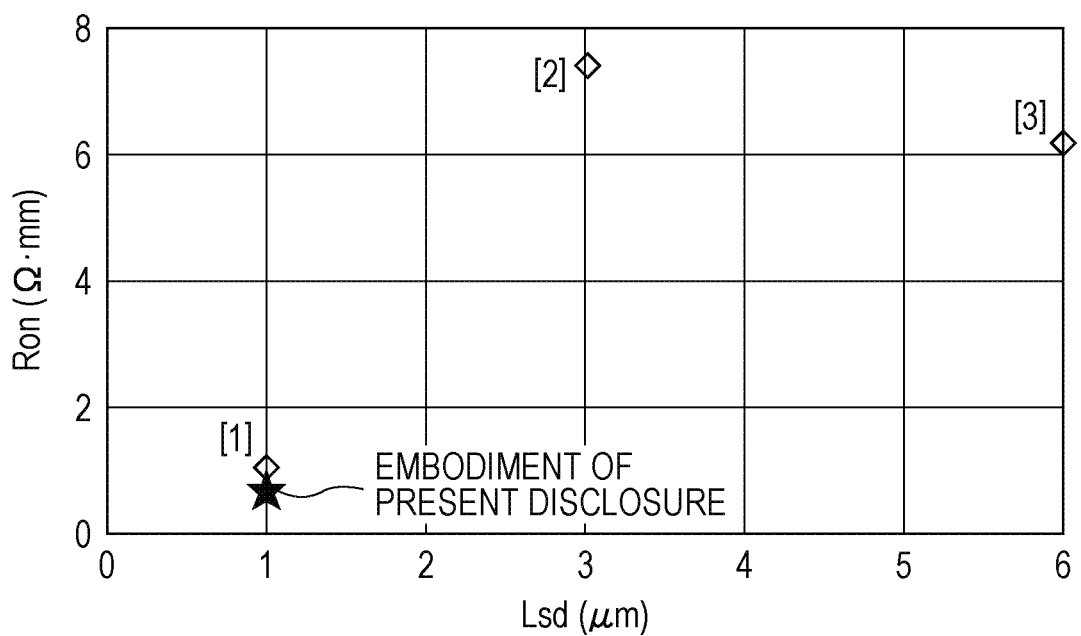
FIG. 13 is a graph showing the relationship between the source-drain length Lsd and the on-resistance Ron of the nitride semiconductor device according to the first embodiment in comparison to the values disclosed in prior art documents.

In FIG. 13, the values of Lsd and Ron shown in the following literatures 1 to 3 and the results of the nitride semiconductor device 200 described above are collectively shown.

[1] A. L. Corrion et at., IEEE EDL, Vol. 31, p. 1,116, 2010
[2] H. Hilt et at., ISPSD Tech. Dig., p. 239, 2011
[3] M. Kanamura et at., IEEE EDL, Vol. 31, p. 189, 2010

In the nitride semiconductor device of this embodiment, a lower on-resistance than the values shown in the literatures 1 to 3 is obtained, and it was found that the nitride semiconductor device of this embodiment has a structure capable of effectively reducing the on-resistance.

As has thus been described, according to the nitride semiconductor device of this embodiment, at the source side and the drain side, the nitride semiconductor regrowth layer formed on the recess region is in contact with the vicinity of the interface between the second nitride semiconductor layer and the first nitride semiconductor layer, the vicinity of the interface being exposed to the side surface of the recess region. Hence, the impurity can be diffused from the nitride semiconductor regrowth layer to the first nitride semiconductor layer, so that a low resistance contact with the 2DEG can be realized. Accordingly, a nitride semiconductor device having a low on-resistance can be realized. In addition, since the nitride semiconductor regrowth layer is an epitaxially grown layer, the impurity is likely to be diffused from the nitride semiconductor regrowth layer to the lattice-matched first nitride semiconductor layer. Hence, the contact resistance can be effectively reduced. In addition, since the gate layer formed of a p-type metal oxide semiconductor is further provided, a nitride semiconductor device having a normally-off characteristic can be realized. Accordingly, a nitride semiconductor device which can simultaneously satisfy a normally-off characteristic and a low on-resistance can be realized.

In addition, Japanese Unexamined Patent Application Publication No. 2013-98556 has disclosed a nitride semiconductor device having, between a GaN semiconductor layer and each of a source electrode and a drain electrode, a mono-element layer, such as a Ge layer, a Si layer, a Sn layer, or a Pb layer, or a compound layer, such as a GeSi layer, as a diffusion layer. However, since those layers are not semiconductor layers, in general, it cannot be always said that the elements forming those layers are preferably diffused to the GaN semiconductor layer as an impurity. In addition, in Japanese Unexamined Patent Application Publication No. 2013-98556, it is intended to diffuse a constituent element primarily from the diffusion layer in a lamination direction. However, it has not been apparent whether the constituent element is diffused so as to form a low resistance contact with the 2DEG.

Second Embodiment

Hereinafter, a nitride semiconductor device of a second embodiment and a method for manufacturing the same will be described. FIG. 14 is a cross-sectional view showing a nitride semiconductor device 300 of this embodiment. In the nitride semiconductor device 300, a constituent element having a substantially similar structure/function to that of the nitride semiconductor device 200 of the first embodiment is called by the same name as that thereof and is designated by 300 with the last two digits of the reference numeral of the constituent element of the nitride semiconductor device 200.

As shown in FIG. 14, the nitride semiconductor device 300 is a hetero-junction field effect transistor (HFET), and on a first surface of a substrate 301, a nitride buffer layer 302, a first nitride semiconductor layer 303, and a second nitride semiconductor layer 304 are formed in this order.

A source-side recess region 310a and drain-side recess region 310b are each formed by engraving the first nitride semiconductor layer 303 to a predetermined depth through a part of the second nitride semiconductor layer 304. On the source-side recess region 310a, a source-side nitride semiconductor regrowth layer 305a formed of a nitride semiconductor material containing an s-type impurity at a high concentration is located. In addition, a source electrode 305b electrically connected to the source-side nitride semiconductor regrowth layer 305a is provided, and by the source-side nitride semiconductor regrowth layer 305a and the source electrode 305b, a composite source electrode 305 is formed.

As is the case described above, on the drain-side recess region 310b, a drain-side nitride semiconductor regrowth layer 306a formed of a nitride semiconductor material containing an n-type impurity at a high concentration is located. In addition, a drain electrode 306b electrically connected to the drain-side nitride semiconductor regrowth layer 306a is provided, and by the drain-side nitride semiconductor regrowth layer 306a and the drain electrode 306b, a composite drain electrode 306 is formed.

On the second nitride semiconductor layer 304 and between the composite source electrode 305 and the composite drain electrode 306, an insulating passivation layer 307 is formed so as to be apart from the electrodes 305 and 306. In the insulating passivation layer 307, an opening 308 having a bottom surface 308a and a side surface 308b is provided, and by this opening, the insulating passivation layer 307 is divided into two segments at a source electrode side and a drain electrode side. A gate layer 311 is provided in the opening 308 in the insulating passivation layer 307. In particular, the gate layer 311 is formed on the second nitride semiconductor layer 304 exposed to the bottom surface 308a so as to divide the insulating passivation layer 307 into the source electrode side and the drain electrode side. As shown in FIG. 14, the gate layer 311 is formed so as to be in contact with the second nitride semiconductor layer 304 and the side surface of the insulating passivation layer 307. A gate electrode 309 is formed so as to cover the gate layer 311 and a part of the insulating passivation layer 307.

As shown in FIG. 14, the insulating passivation layer 307 is formed on the second nitride semiconductor layer 304 so as to be apart from the composite source electrode 305 and the composite drain electrode 306 with spaces provided therebetween. The second nitride semiconductor layer 304 has a predetermined thickness and is formed to have a uniform Al composition. The gate layer 311 is formed on the second nitride semiconductor layer 304 and on the side surface of the insulating passivation layer 307. The gate layer 311 is formed of a p-type metal oxide semiconductor.

Hereinafter, with reference to FIGS. 15A to 15H, a method for manufacturing the nitride semiconductor device 300 will be described. In order to avoid the duplication, description of the constituent element or the structure which can be formed by a step similar to that for the nitride semiconductor device 200 of the first embodiment will be omitted.

Figure 15A:
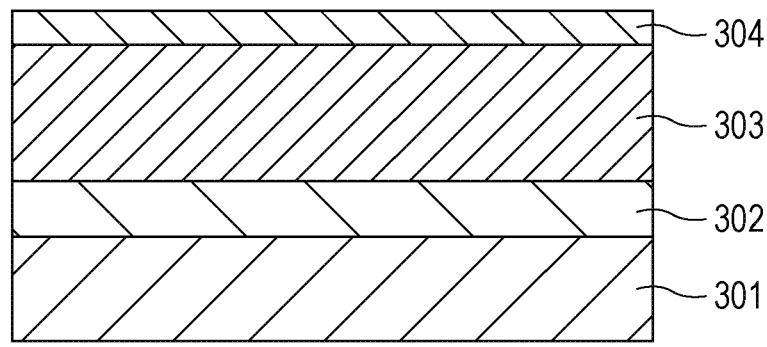
FIG. 15A is a cross-sectional view showing a step of a method for manufacturing the nitride semiconductor device according to the second embodiment.

First, as shown in FIG. 15A, by using a crystal growth apparatus, such as a MOCVD apparatus, as in the first embodiment, the nitride buffer layer 302, the first nitride semiconductor layer 303, and the second nitride semiconductor layer 304 are grown in this order on the substrate 301. Next, the insulating passivation layer 307 is formed on the entire surface of the second nitride semiconductor layer 304 (not shown). The insulating passivation layer 307 is formed, for example, of silicon nitride (SiNx) and has a thickness of 300 nm. When the adhesion is important, for example, a dual-layered insulating passivation layer 307 including a silicon nitride (SiNx) layer having a thickness of 300 nm and a silicon oxide (SiO$_x$) layer having a thickness of 10 nm may be formed.

Figure 15B:
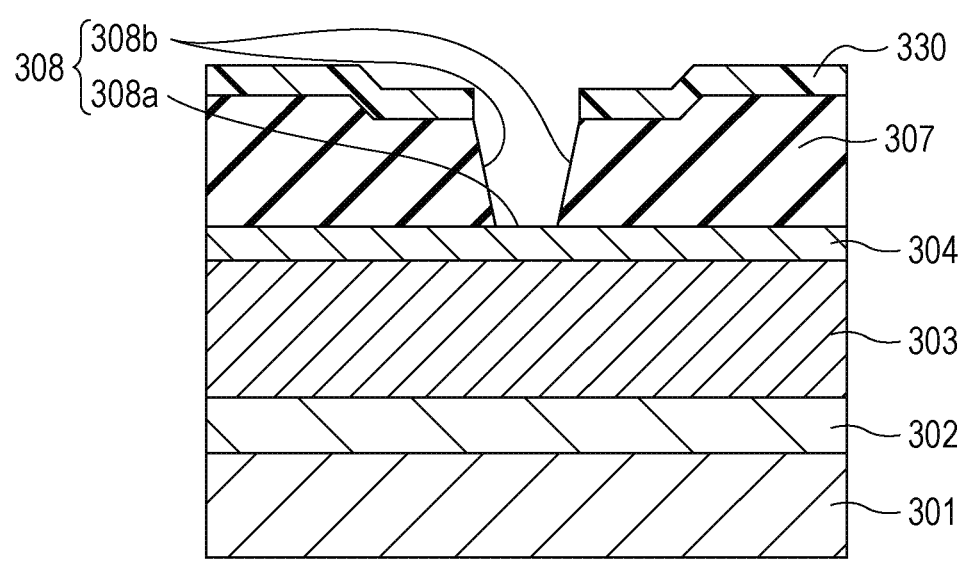
FIG. 15B is a cross-sectional view showing another step of the method for manufacturing the nitride semiconductor device according to the second embodiment.
Figure 15C:
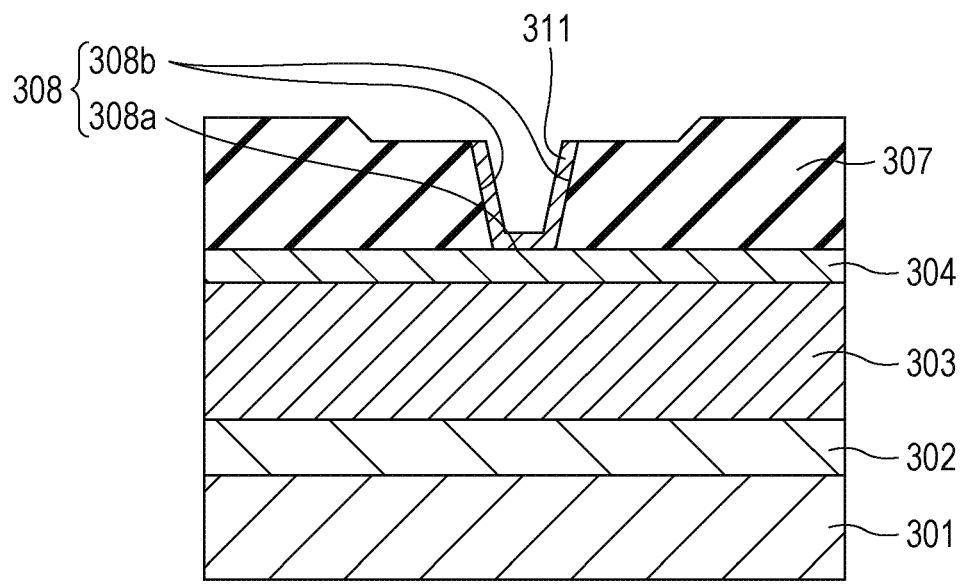
FIG. 15C is a cross-sectional view showing another step of the method for manufacturing the nitride semiconductor device according to the second embodiment.
Figure 15D:
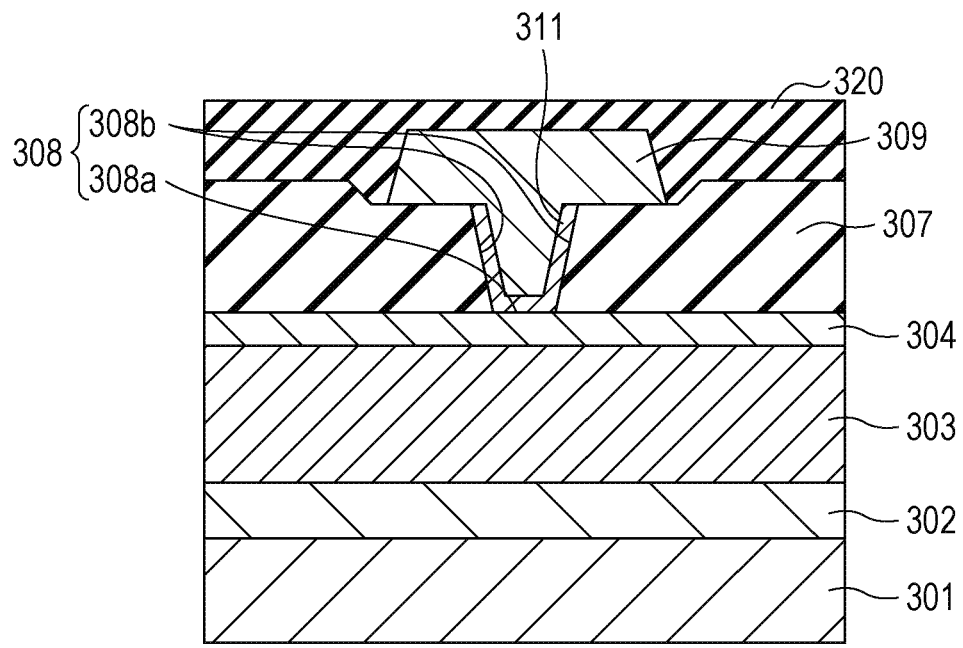
FIG. 15D is a cross-sectional view showing another step of the method for manufacturing the nitride semiconductor device according to the second embodiment.

Subsequently, as shown in FIG. 15B, by a lithography method, a resist layer 330 is formed having a pattern which defines a region in which the gate layer 311 is formed. Next, the insulating passivation layer 307 is etched using the resist layer 330 as a mask, so that the opening 308 reaching the second nitride semiconductor layer 304 is formed. Subsequently, as shown in FIG. 15C, the gate layer 311 is formed so as to be in contact with the bottom surface 308a and the side surface 308b of the opening 308 provided in the insulating passivation layer 307. The gate layer 311 is formed of a p-type metal oxide semiconductor. For example, as the gate layer 311, a NiO layer having a thickness of 50 nm is formed. Next, as shown in FIG. 15D, the gate electrode 309 is formed so as to cover a peripheral portion of the opening 308 in the insulating passivation layer 307 and the entire upper surface of the gate layer 311. Furthermore, a SiO$_2$ film 320 is formed so as to entirely cover the insulating passivation layer 307 and the gate electrode 309.

Figure 15E:
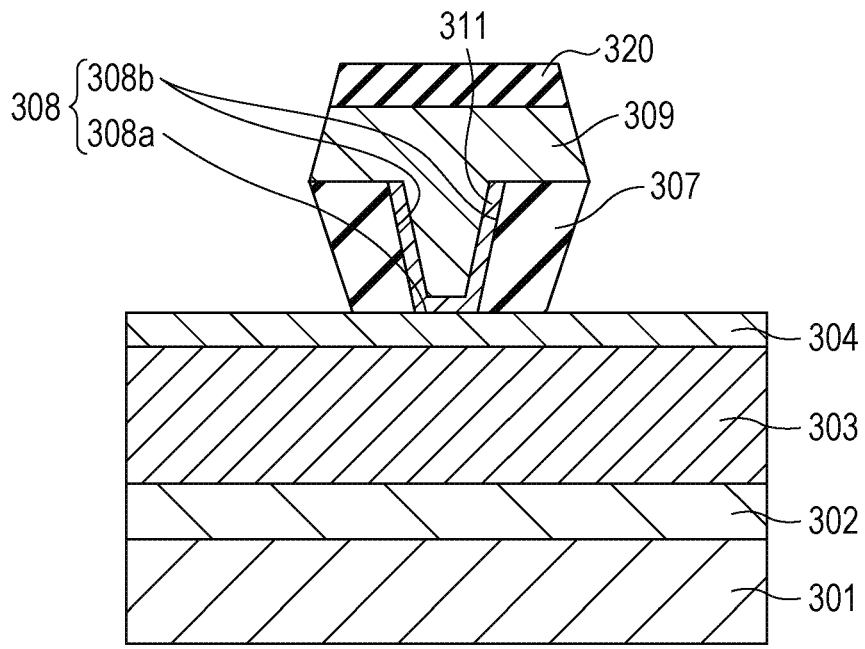
FIG. 15E is a cross-sectional view showing another step of the method for manufacturing the nitride semiconductor device according to the second embodiment.

Next, a resist layer (not shown) having a pattern covering only the gate electrode 309 is formed on the SiO$_2$ film 320, Subsequently, by using a dry etching apparatus, the SiO$_2$ film 320 and the insulating passivation layer 307 are etched so as to expose the second nitride semiconductor layer 304, In this step, as shown in FIG. 15E, under the gate electrode 309, the insulating passivation layer 307 is etched so as to have a reverse tapered shape. The etching method and the etching gas to be used may be the same as those in the first embodiment.

Figure 15F:
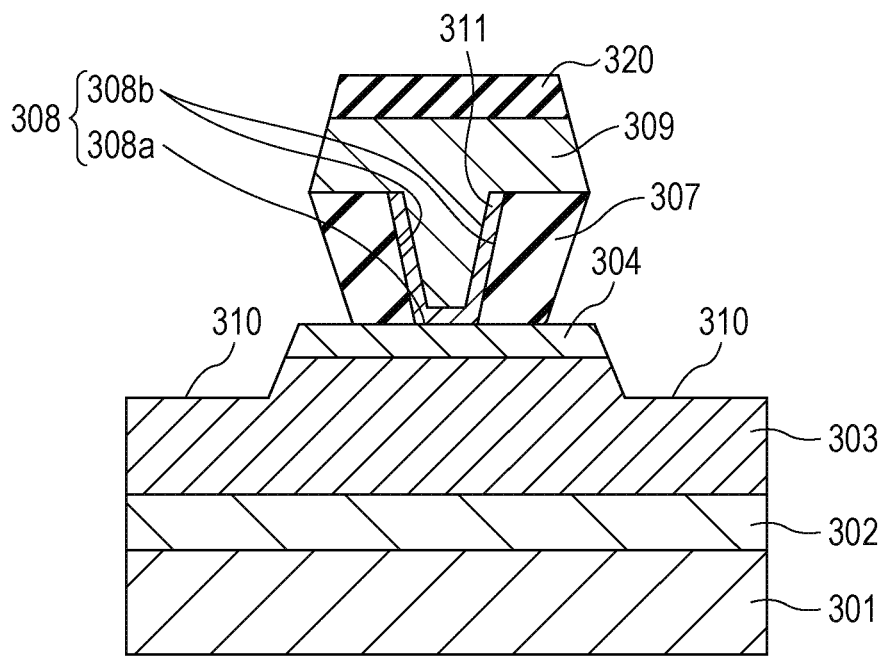
FIG. 15F is a cross-sectional view showing another step of the method for manufacturing the nitride semiconductor device according to the second embodiment.

Subsequently, the second nitride semiconductor layer 304 and the first nitride semiconductor layer 303 are etched using the resist layer provided on the SiO$_2$ film 320 as a mask, so that the recess region 310 is formed. Since the resist layer on the SiO$_2$ film 320 is used as a mask, the recess region 310 is formed by self-aligned process with respect to the gate electrode 309. After the recess region 310 is formed, the resist layer is peeled away. Accordingly, as shown in FIG. 15F, the recess region 310 arranged by self-aligned process with respect to the SiO$_2$ film 320 and the gate electrode 309 is formed.

Figure 15G:
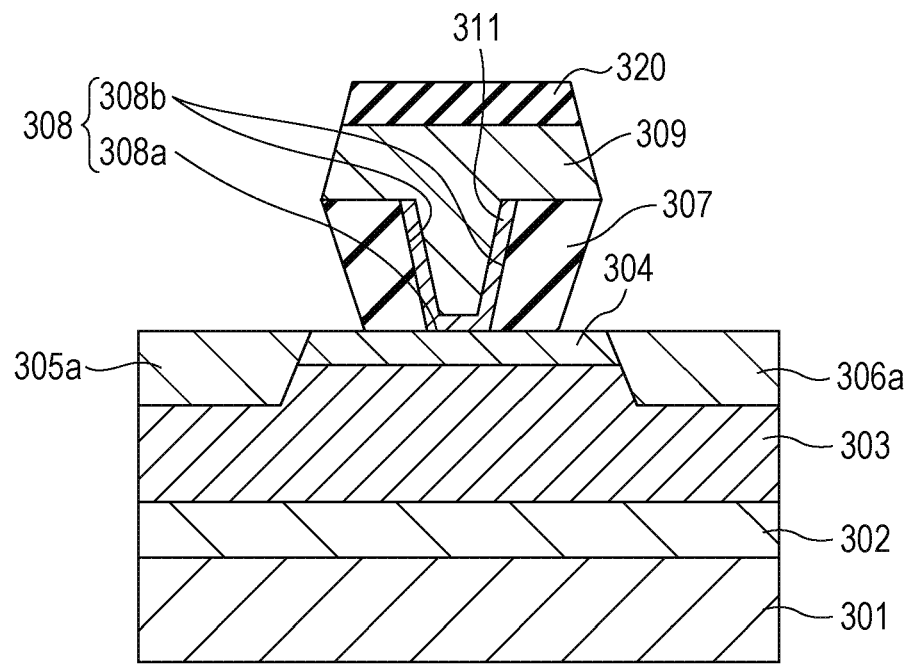
FIG. 15G is a cross-sectional view showing another step of the method for manufacturing the nitride semiconductor device according to the second embodiment.

Next, the substrate 301 having the structure as described above is again set in a crystal growth apparatus, and the source-side nitride semiconductor regrowth layer 305a and the drain-side nitride semiconductor regrowth layer 306a are formed. In this step, the SiO$_2$ film 320 also functions as a mask, and the nitride semiconductor regrowth layer is formed only on the recess region 310. Accordingly, the source-side nitride semiconductor regrowth layer 305a and the drain-side nitride semiconductor regrowth layer 306a as shown in FIG. 15G are formed.

Next, the SiO$_2$ film 320 used as a mask in the regrowth is removed by wet etching.

Figure 15H:
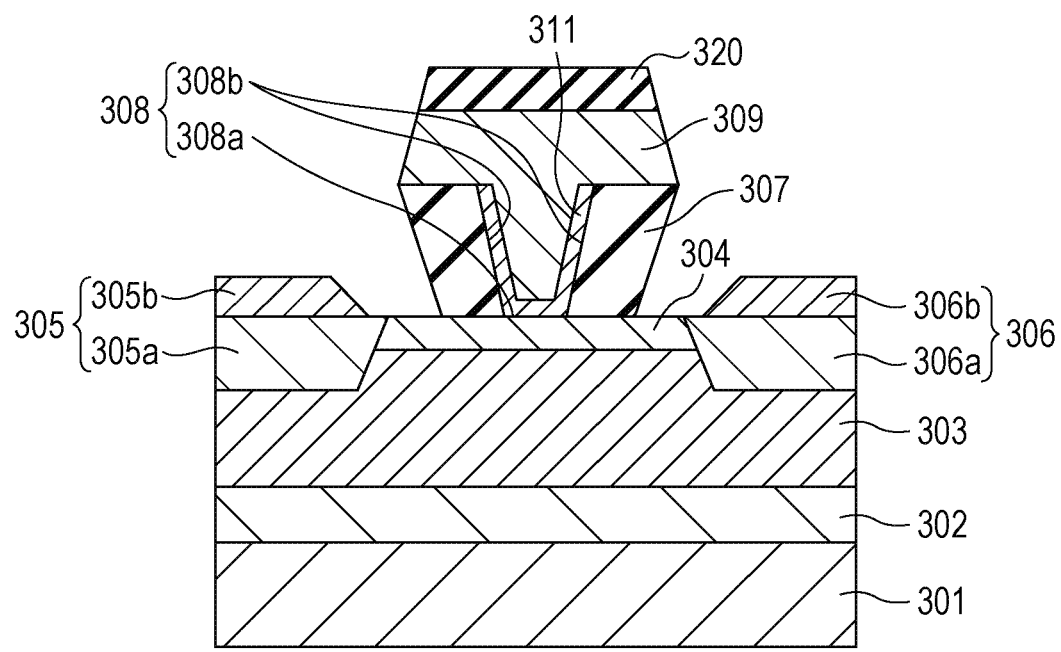
FIG. 15H is a cross-sectional view showing another step of the method for manufacturing the nitride semiconductor device according to the second embodiment.

Subsequently, by a lithography method, a resist layer (not shown) is formed having openings in regions in which the source electrode 305b and the drain electrode 306b are formed. By a vapor deposition apparatus, ohmic-electrode metal films of Ti, Al, and Hf having thicknesses of 20, 400, and 20 nm, respectively, are formed on the resist layer and parts of the source-side nitride semiconductor regrowth layer 305a and the drain-side nitride semiconductor regrowth layer 306a, which are exposed through the resist layer. Next, by a lift-off method, the resist layer and unnecessary portions of the ohmic-electrode metal films thereon are removed, so that as shown in FIG. 15H, the source electrode 305b and the drain electrode 306b are formed. Accordingly, the composite source electrode 305 and the composite drain electrode 306 are formed.

By the manufacturing method described above, the nitride semiconductor device 300 of this embodiment can be formed. In the nitride semiconductor device 300, since the recess region 310, the source-side nitride semiconductor regrowth layer 305a, and the drain-side nitride semiconductor regrowth layer 306a can be formed by self-aligned process, the source-drain length Lsd can be accurately decreased. Hence, a nitride semiconductor device 300 having a further reduced on-resistance can be realized.

As is the nitride semiconductor device 200 of the first embodiment, the nitride semiconductor device 300 of this embodiment can also simultaneously realize a normally-off characteristic and a low on-resistance.

In addition, one of the features of the nitride semiconductor device of this disclosure is to realize a low on-resistance, and this feature can be applied not only to a normally-off HFET but also to a normally-on HFET. In addition, the structure which realizes a low on-resistance can also be applied to a related normally-off HFET.

What is claimed is:

1. A nitride semiconductor device comprising:
    a substrate;
    a first nitride semiconductor layer supported by the substrate;
    a second nitride semiconductor layer which is disposed on the first nitride semiconductor layer and which includes a second nitride semiconductor having a larger bandgap than that of a first nitride semiconductor included in the first nitride semiconductor layer;
    a source-side nitride semiconductor regrowth layer which is located on a source-side recess region and which includes a third nitride semiconductor containing Ge, the source-side recess region having a first recess which extends through a part of the second nitride semiconductor layer to reach the first nitride semiconductor layer;
    a source electrode electrically connected to the source-side nitride semiconductor regrowth layer;
    a drain-side nitride semiconductor regrowth layer which is located on a drain-side recess region and which includes a fourth nitride semiconductor containing Ge, the drain-side recess region located apart from the source-side recess region and having a second recess which extends through another part of the second nitride semiconductor layer to reach the first nitride semiconductor layer;
    a drain electrode electrically connected to the drain-side nitride semiconductor regrowth layer;
    a gate electrode located on the second nitride semiconductor layer between the source-side nitride semiconductor regrowth layer and the drain-side nitride semiconductor regrowth layer;
    a first diffusion layer which is disposed in the first nitride semiconductor layer and which contains Ge diffused from the source-side nitride semiconductor regrowth layer to the first nitride semiconductor layer; and
    a second diffusion layer which is disposed in the first nitride semiconductor layer and which contains Ge diffused from the drain-side nitride semiconductor regrowth layer to the first nitride semiconductor layer.

2. The nitride semiconductor device according to claim 1, wherein the source-side nitride semiconductor regrowth layer and the drain-side nitride semiconductor regrowth layer each have a facet which forms an angle of 25° to 35° with the normal of the substrate.

3. The nitride semiconductor device according to claim 1, wherein carrier concentrations of Ge of the source-side nitride semiconductor regrowth layer and Ge of the drain-side nitride semiconductor regrowth layer are each $1 \times 10^{18}$ to $5 \times 10^{20}$ cm$^{-3}$.

4. The nitride semiconductor device according to claim 1, wherein impurity concentrations of Ge of the source-side nitride semiconductor regrowth layer and Ge of the drain-side nitride semiconductor regrowth layer are each $1 \times 10^{19}$ to $1 \times 10^{22}$ cm$^{-3}$.

5. The nitride semiconductor device according to claim 1, further comprising: an insulating passivation layer which covers at least a part of the second nitride semiconductor layer located between the source-side recess region and the drain-side recess region and which has an opening to expose the second nitride semiconductor layer,
    wherein the insulating passivation layer includes a nitride passivation layer and an oxide passivation layer located on the nitride passivation layer, and
    the oxide passivation layer has a thickness of 50 to 700 nm.

6. The nitride semiconductor device according to claim 1, wherein the third nitride semiconductor and the fourth nitride semiconductor each have a composition represented by $Al_yGa_{1-y-z}In_zN$ ($0 \leq y \leq 0.3$, $0 \leq z \leq 1$).

7. The nitride semiconductor device according to claim 1, wherein the first nitride semiconductor has a composition represented by $Al_xGa_{1-x}N$ ($0 \leq x \leq 1$), and
    the second nitride semiconductor has a composition represented by $Al_yGa_{1-y-z}In_zN$ ($0 \leq y \leq 1$, $0 \leq z \leq 1$).

8. The nitride semiconductor or device according to claim 1,
    wherein the second nitride semiconductor layer includes an AlN layer having a thickness of 0.5 to 4 nm and a semiconductor layer including a fifth nitride semiconductor having a composition represented by $Al_yGa_{1-y-z}In_zN$ ($0 \leq y < 1$, $0 \leq z \leq 1$), and
    the AlN layer is located between the substrate and the semiconductor layer.

9. The nitride semiconductor device according to claim 1, further comprising a gate layer which is located at least between the second nitride semiconductor layer and the gate electrode and includes a p-type metal oxide semiconductor.

10. The nitride semiconductor device according to claim 9,
    wherein the gate layer covers at least a part of a side surface of the gate electrode.

11. The nitride semiconductor device according to claim 9, further comprising an insulating passivation layer which covers at least a part of the second nitride semiconductor layer located between the source-side recess region and the drain-side recess region and which has an opening to expose the second nitride semiconductor layer,
wherein at least a part of the gate electrode is located in the opening.

12. The nitride semiconductor device according to claim 11,
wherein the insulating passivation layer is not in contact with the source electrode, the drain electrode, the source-side nitride semiconductor regrowth layer, and the drain-side nitride semiconductor regrowth layer.

13. The nitride semiconductor device according to claim 1,
wherein the second nitride semiconductor has a higher Al composition than that of the first nitride semiconductor.

14. The nitride semiconductor device according to claim 1,
wherein a length between the source electrode and the drain electrode is 5 μm or less.

15. The nitride semiconductor device according to claim 9,
wherein the p-type metal oxide semiconductor includes nickel oxide.

16. The nitride semiconductor device according to claim 9,
wherein the p-type metal oxide semiconductor has a hole concentration of $5 \times 10^{15}$ to $1 \times 10^{19}$ $cm^{-3}$.

17. The nitride semiconductor device according to claim 15,
wherein the p-type metal oxide semiconductor contains at least one element selected from the group consisting of lithium, sodium, potassium, rubidium, and cesium at a concentration of $1 \times 10^{17}$ to $1 \times 10^{21}$ $cm^{-3}$.

18. The nitride semiconductor device according to claim 9,
wherein the p-type metal oxide semiconductor has a crystallinity oriented in a (111) direction.

19. The nitride semiconductor device according to claim 11,
wherein the gate layer is located on a bottom surface and a side surface of the opening.

20. The nitride semiconductor device according to claim 11,
wherein a part of the gate layer is located on an upper portion of the insulating passivation layer.

21. The nitride semiconductor device according to claim 1,
wherein a depth of the first recess and a depth of the second recess from a surface of the second nitride semiconductor layer are each 20 to 200 nm.

22. The nitride semiconductor device according to claim 1,
wherein the source-side nitride semiconductor regrowth layer and the drain-side nitride semiconductor regrowth layer each have a thickness of 30 to 500 nm.

* * * * *